(12) United States Patent
Takenaka

(10) Patent No.: US 12,400,705 B2
(45) Date of Patent: Aug. 26, 2025

(54) NON-VOLATILE MEMORY

(71) Applicant: Rohm Co., Ltd., Kyoto (JP)

(72) Inventor: Seiji Takenaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 224 days.

(21) Appl. No.: 18/247,487

(22) PCT Filed: Sep. 9, 2021

(86) PCT No.: PCT/JP2021/033152
§ 371 (c)(1),
(2) Date: Mar. 31, 2023

(87) PCT Pub. No.: WO2022/075002
PCT Pub. Date: Apr. 14, 2022

(65) Prior Publication Data
US 2024/0005981 A1    Jan. 4, 2024

(30) Foreign Application Priority Data
Oct. 6, 2020 (JP) ................. 2020-169298

(51) Int. Cl.
*G11C 7/10* (2006.01)
*G11C 11/4074* (2006.01)
(Continued)

(52) U.S. Cl.
CPC ...... *G11C 11/4096* (2013.01); *G11C 11/4074* (2013.01); *G11C 11/4093* (2013.01)

(58) Field of Classification Search
CPC ................. G11C 11/4096; G11C 11/4074; G11C 11/409
See application file for complete search history.

(56) References Cited

U.S. PATENT DOCUMENTS 6,009,032 A * 12/1999 Lin .................. G11C 7/062
365/207
7,116,597 B1   10/2006 Goldman et al.
(Continued)

FOREIGN PATENT DOCUMENTS

DE   102008019927   11/2008
DE   102013101675   10/2013
(Continued)

OTHER PUBLICATIONS

International Search Report for PCT/JP2021/033152 dated Oct. 19, 2021, with English translation (4 pages).
(Continued)

*Primary Examiner* — Min Huang
(74) *Attorney, Agent, or Firm* — Fish & Richardson P.C.

(57) ABSTRACT

There are disposed second and third transistors whose gates are connected to each other, and first and fourth transistors whose gates are connected to each other. Sources of the first to fourth transistors are connected to each other. A read operation is performed in a state where drain current is supplied to the fourth transistor, and drain current larger than that of the fourth transistor is supplied to the third transistor. In the read operation, a signal associated with a first or second value is output based on drain currents of the first and second transistors.

7 Claims, 14 Drawing Sheets

(51) Int. Cl.
    *G11C 11/4093*     (2006.01)
    *G11C 11/4096*     (2006.01)

(56) References Cited

U.S. PATENT DOCUMENTS

| | | |
|---|---|---|
| 7,800,968 B2 | 9/2010 | Kern |
| 8,902,641 B2 | 12/2014 | Chih et al. |
| 2008/0273394 A1 | 11/2008 | Kern |
| 2013/0265820 A1 | 10/2013 | Chih et al. |
| 2014/0022855 A1 | 1/2014 | Jang et al. |
| 2023/0377617 A1* | 11/2023 | Takenaka ............ G11C 7/1069 |

FOREIGN PATENT DOCUMENTS

| | | |
|---|---|---|
| JP | 2008-210467 | 9/2008 |
| JP | 2010-211894 | 9/2010 |
| JP | 2011103158 | 5/2011 |

OTHER PUBLICATIONS

DE OA—German Patent and Trademark Office, Office Action in German Appln. No. 112021004209.2, dated Nov. 11, 2024, 10 pages (with English translation).
JP OA—Japanese Patent Office, Office Action in Japanese Appln. No. 2022-555324, dated May 20, 2025, 4 pages (with machine translation).

* cited by examiner

READ CURRENT SUPPLY STATE
(BEFORE PROGRAM OPERATION)

FIG.8 [PRECHARGE PERIOD]

FIG.9 [READ PERIOD]

FIG.12 [PROGRAM PERIOD]

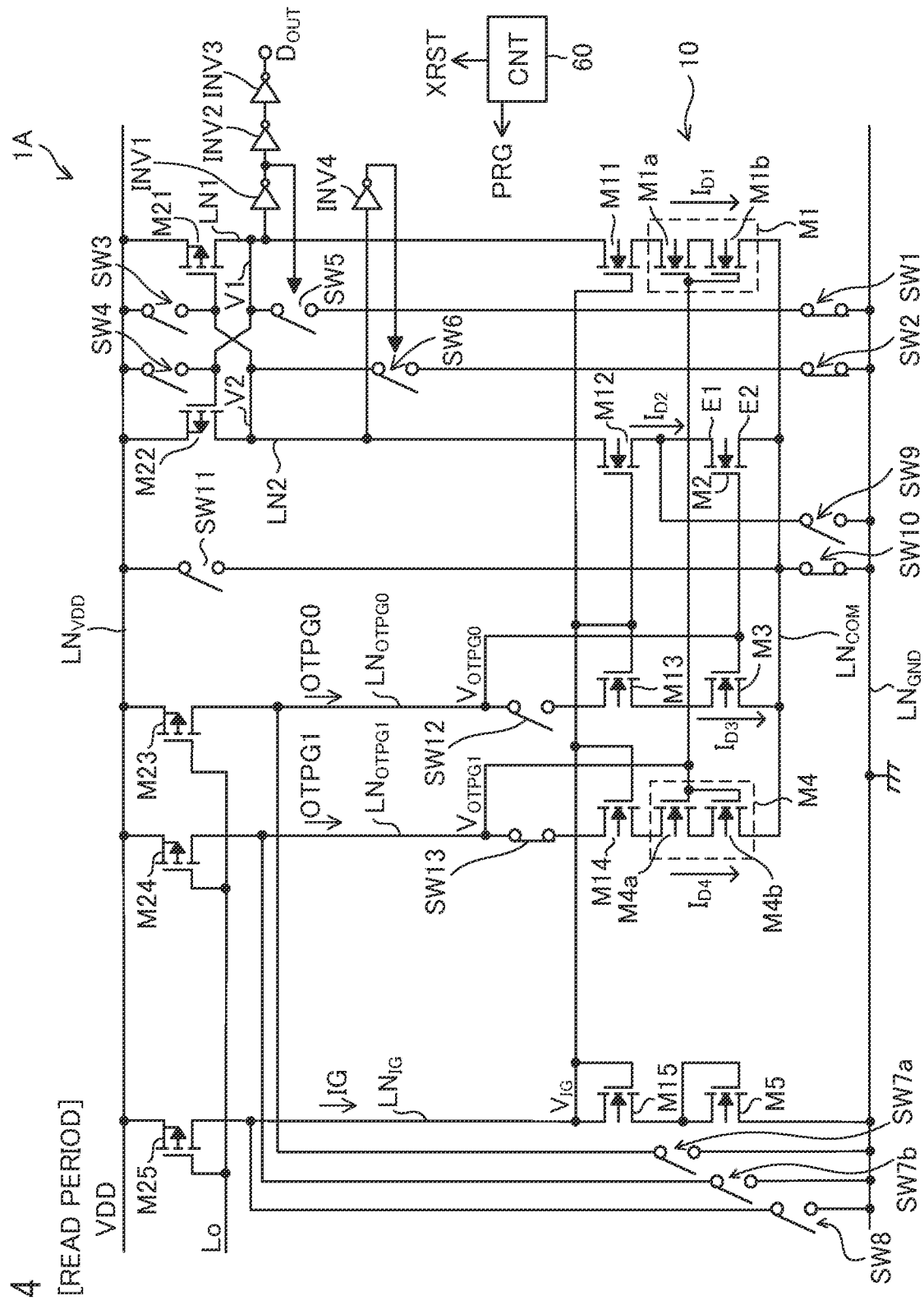

NON-VOLATILE MEMORY

CROSS REFERENCE OF RELATED APPLICATIONS

This application is a U.S. National Phase application under 35 U.S.C. § 371 of International Patent Application No. PCT/JP2021/033152, filed on Sep. 9, 2021, which claims the priority of Japanese Patent Application No. 2020-169298, filed on Oct. 6, 2020, the disclosure of which is incorporated herein by reference in its entirety.

TECHNICAL FIELD

The present disclosure relates to a non-volatile memory.

BACKGROUND ART

There is a non-volatile memory that utilizes hot carrier injection into a transistor. This type of non-volatile memory includes first and second transistors as memory elements whose characteristics are made uniform in the initial state, and hot carriers are injected into only one of the transistors to change the characteristics thereof. In read operation after that, on the basis of large/small relationship between drain currents when the same gate voltage is applied to the first and second transistors, stored data "0" or "1" is read out. For instance, a state where the drain current of the first transistor is smaller (a state where characteristics of the first transistor are changed) corresponds to a state where data "0" is stored, while a state where the drain current of the second transistor is smaller (a state where characteristics of the second transistor are changed) corresponds to a state where data "1" is stored.

However, in the non-volatile memory described above, stored data (stored value) in the initial state is unstable. In this case, other peripheral circuit needs to perform a process for responding to the unstableness of stored data, which may be inconvenient in the light of the circuit scale or the like. There is proposed a non-volatile memory configured so that more drain current flows in the second transistor out of the first and second transistors in the initial state, in order to prevent unstableness of the stored data in the initial state. In this type of non-volatile memory, the stored data can be defined to be "0" in the initial state, and the stored data can be "1" after hot carrier injection into the second transistor.

LIST OF CITATIONS

Patent Literature

Patent Document 1: JP-A-2011-103158

SUMMARY OF THE DISCLOSURE

Technical Problem

On the other hand, it is often required that sizes of the memory elements (the first and second transistors) are reduced in order to reduce the entire size of the circuit. When the sizes of the memory elements are reduced, mismatch of characteristics between the memory elements increases. Characteristics of a plurality of transistors, which are formed in pursuit of uniformed characteristics, may become largely shifted from each other in reality, and this shift corresponds to the mismatch. Such mismatch causes inconvenience such as inhibition of proper storage and read of data (as described later in detail). It is desired to develop a non-volatile memory that is hardly affected by the mismatch.

It is an object of the present disclosure to provide a non-volatile memory that is hardly affected by the mismatch.

Means for Solving the Problem

The non-volatile memory according to the present disclosure includes a first transistor, a second transistor, a third transistor having a gate connected to a gate of the second transistor, a fourth transistor having a gate connected to a gate of the first transistor, a line to which sources of the first to fourth transistors are commonly connected, a supply circuit configured to be capable of supplying drain currents to the third and fourth transistors, and a signal output circuit. A read operation is performed in a read current supply state where the supply circuit supplies drain current of the fourth transistor and supplies drain current larger than that of the fourth transistor to the third transistor. The signal output circuit is configured to output a signal associated with a first value or a signal associated with a second value in the read operation, based on drain currents of the first and second transistors.

Advantageous Effects of the Disclosure

According to the present disclosure, it is possible to provide a non-volatile memory that is hardly affected by the mismatch.

BRIEF DESCRIPTION OF DRAWINGS

FIG. 14 is a diagram illustrating a switch state when a second margin process is performed, according to a third example of the embodiment of the present disclosure.

DESCRIPTION OF EMBODIMENTS

Figure 1:
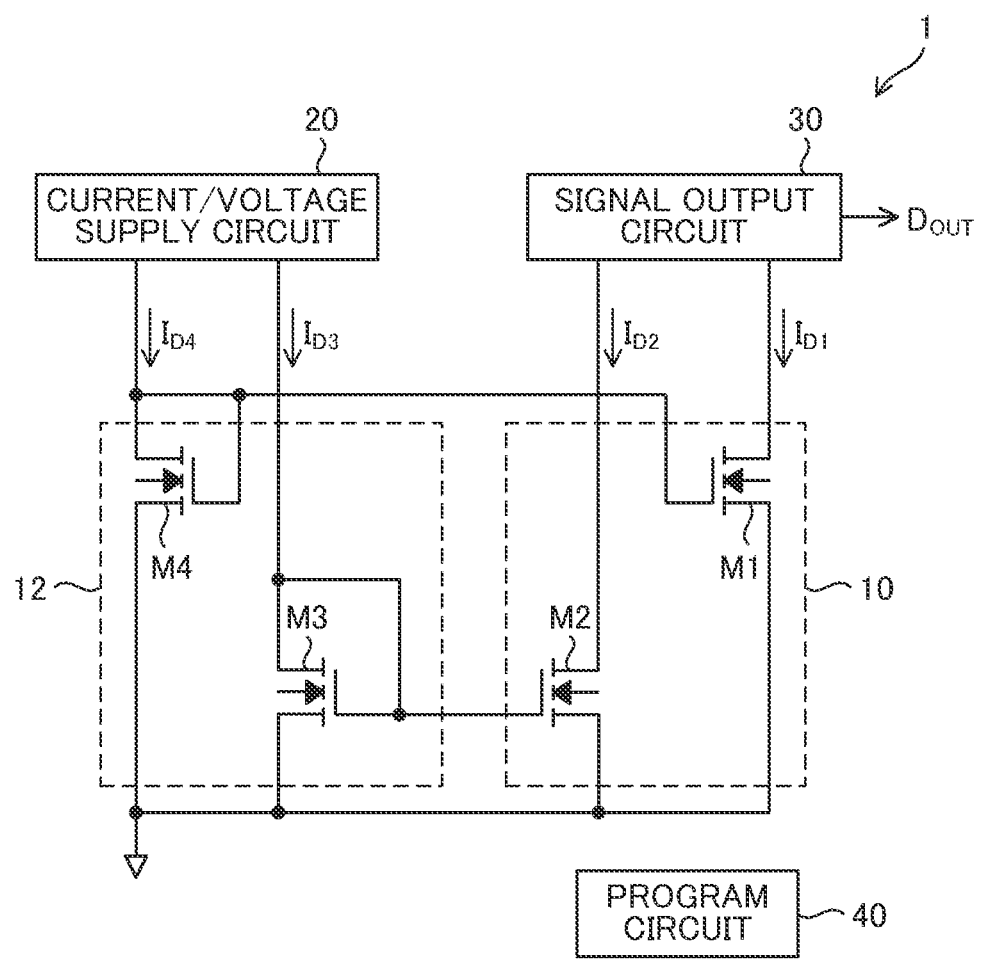
FIG. 1 is a configuration diagram of a storage circuit according to an embodiment of the present disclosure.

Hereinafter, an example of an embodiment of the present disclosure is specifically described with reference to the drawings. In the drawings that are referred to, the same part is denoted by the same numeral or symbol, and overlapping description of the same part is omitted in principle. Note that in this specification, for simple description, a name of information, signal, physical quantity, element, part, or the like may be omitted or shortened by writing its numeral or symbol. For instance, a current/voltage supply circuit denoted by 20 as described later (see FIG. 1) can be expressed as a current/voltage supply circuit 20 or can be shortly expressed as a supply circuit 20, both of which indicate the same thing.

First, some terms to be used in the description of the embodiment of the present disclosure are defined as follows. Line means a wiring for transmitting or applying an electric signal. Ground means a reference conductive part having a potential of 0 V (zero volts) as a reference, or the 0 V potential itself. The reference conductive part is made of a conductor such as a metal. The 0 V potential may be referred to as ground potential. In the embodiment of the present disclosure, a voltage without a specific reference means a potential with respect to the ground. A level means a potential level. As for any noted signal or voltage, high level has a potential higher than that of low level. As for any noted signal or voltage, if the signal or voltage is at high level, it means that the level of the signal or the voltage is at high level, while if the signal or the voltage is at low level, it means that the level of the signal or the voltage is at low level. A level of a signal may be expressed as a signal level, and a level of a voltage may be expressed as a voltage level.

For any transistor configured as an FET (field-effect transistor), which can be a MOSFET, "on-state" refers to a state where the drain-source channel of the transistor is conducting, and "off-state" refers to a state where the drain-source channel of the transistor is not conducting (cut off). The same is true for other transistors that are not classified as FET. The MOSFET is understood to be an enhancement type of MOSFET unless otherwise noted. MOSFET is an abbreviation of "metal-oxide-semiconductor field-effect transistor".

Electric characteristics of a MOSFET include gate threshold voltage. In any transistor that is an N-channel type and enhancement type of MOSFET, if the gate potential of the transistor is higher than the source potential of the transistor, and if the magnitude of the gate-source voltage (the gate potential with respect to source potential) of the transistor is the gate threshold voltage of the transistor or higher, the transistor becomes on-state, and otherwise the transistor becomes off-state. In any transistor that is an P-channel type and enhancement type of MOSFET, if the gate potential of the transistor is lower than the source potential of the transistor, and if the magnitude of the gate-source voltage (the gate potential with respect to source potential) of the transistor is the gate threshold voltage of the transistor or higher, the transistor becomes on-state, and otherwise the transistor becomes off-state.

Any switch can be constituted of one or more field effect transistors (FETs). If a switch is in on-state, the switch is connected across the ends. If a switch is in off-state, the switch is not connected across the ends. Hereinafter, on-state and off-state of any transistor or switch may be simply expressed as on and off, respectively.

As for any signal having a signal level at high level or low level, a period during which the signal level is at high level is referred to as a high level period, while a period during which the signal level is at low level is referred to as a low level period. The same is true for any voltage having a voltage level at high level or low level.

FIG. 1 is a configuration diagram of a main part of a storage circuit 1 according to the embodiment of the present disclosure. The storage circuit 1 is anon-volatile memory to store one bit data, which includes a memory unit 10, gate voltage generation unit 12, a current/voltage supply circuit 20, a signal output circuit 30, and a program circuit 40.

The storage circuit 1 may be constituted of a semiconductor integrated circuit. The memory unit 10 includes memory elements M1 and M2, and the memory unit 10 stores data "0" or data "1". The gate voltage generation unit 12 includes a memory element M4 equivalent to the memory element M1 and a memory element M3 equivalent to the memory element M2. The memory elements M1 to M4 are transistors. Therefore, the memory elements M1 to M4 are also referred to as transistors M1 to M4 (first, second, third, and fourth transistors). Each of the transistors M1 to M4 is constituted as an N-channel type MOSFET. The transistor M3 generates a gate voltage of the transistor M2 corresponding to drain current of the transistor M3. The transistor M4 generates a gate voltage of the transistor M1 corresponding to drain current of the transistor M4.

Gates of the transistors M2 and M3 are connected to each other. Gates of the transistors M1 and M4 are connected to each other. Sources of the transistors M1 to M4 are connected to a common line. This common line may have ground potential that is basically 0 V, but it can have a potential different from the ground potential when the program operation is performed as described later. The drains of the transistors M1 and M2 are connected to the signal output circuit 30 via different lines.

Drains of the transistors M3 and M4 are connected to the supply circuit 20 via different lines. In the structure of FIG. 1, the gate and drain of the transistor M3 are short-circuited. However, other element such as a switch may be disposed between the gate and drain of the transistor M3. In the structure of FIG. 1, gate and drain of the transistor M4 are short-circuited. However, other element such as a switch may be disposed between the gate and drain of the transistor M4. Hereinafter, drain currents of the transistors M1, M2, M3, and M4 may be denoted by $I_{D1}$, $I_{D2}$, $I_{D3}$, and $I_{D4}$.

The transistors M2 and M3 have the same structure, and have the same electric characteristics before the program circuit 40 performs the program operation. As described later, a target transistor of the program operation is the transistor M2. Therefore, before the program circuit 40 performs the program operation, the transistors M2 and M3 have the same gate threshold voltage. Before performing the program operation, the transistors M2 and M3 forms a first current mirror circuit in which the transistor M3 is a current input side transistor while the transistor M2 is a current output side transistor, and a ratio between the drain current $I_{D3}$ of the transistor M3 and the drain current $I_{D2}$ of the transistor M2 is 1:1 (however, errors are ignored).

In addition, the transistors M1 and M4 have the same structure, and have the same electric characteristics before and after the program circuit 40 performs the program operation. Therefore, before and after the program circuit 40 performs the program operation, the transistors M1 and M4 have the same gate threshold voltage. The execution of the program operation does not affect electric characteristics of the transistors M1 and M4. Before and after performing the program operation, the transistors M1 and M4 forms a second current mirror circuit in which the transistor M4 is a current input side transistor while the transistor M1 is a current output side transistor, and a ratio between the drain current $I_{D4}$ of the transistor M4 and the drain current $I_{D1}$ of the transistor M1 is 1:1 (however, errors are ignored).

Here, as for transistors, the structure is a concept including size of the transistor. Therefore, if a plurality of transistors have the same structure, it means that the transistors have the same size. If a plurality of transistors have the same structure, and if hot carrier injection by the program operation is not performed on a part or the whole of the transistors, the transistors have the same electric characteristics (including the gate threshold voltage and the like). However, if a plurality of transistors have the same structure or electric characteristics, it means that they are the same by design, and they can include errors in reality (i.e., "the same" should be understood as a concept including errors). The same is true for a current ratio. For instance, if the ratio of one current to another is 1:1, it means the ratio is 1:1 by design, which can include an error in reality.

The storage circuit 1 can perform read operation to read data stored in the memory unit 10 and the program operation (write operation) to rewrite data stored in the memory unit 10 from "0" to "1". Note that in this embodiment, an expression "before performing program operation" and an expression "before program operation" have the same meaning, and an expression "after performing program operation" and an expression "after program operation" have the same meaning.

Figure 2:
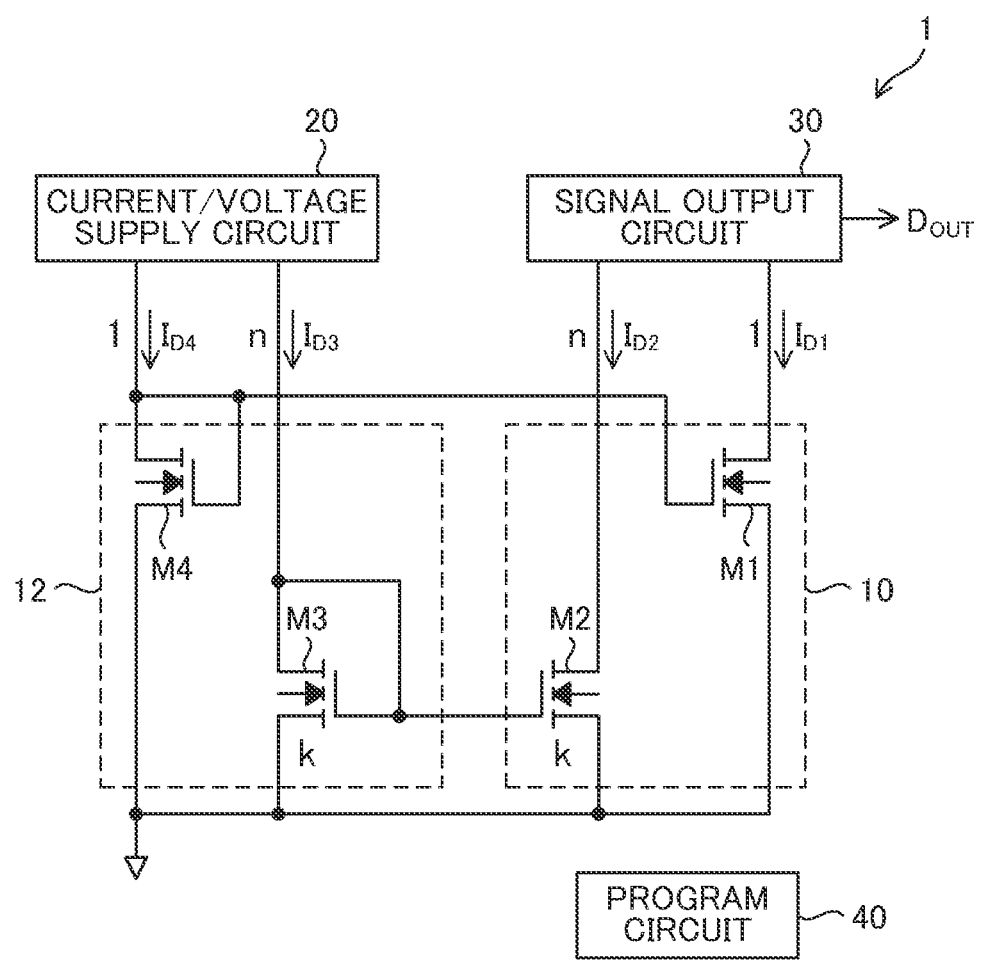
FIG. 2 is a diagram illustrating a read current supply state of the storage circuit, according to the embodiment of the present disclosure.

In the read operation, as illustrated in FIG. 2, the supply circuit 20 can supply drain currents to the transistors M3 and M4 so that a ratio between the drain current $I_{D4}$ of the transistor M4 and the drain current $I_{D3}$ of the transistor M3 becomes 1:n. n is any real number larger than 1, and for example, n=4 holds. The value of n may not be limited to an integer (e.g., n=4.5 may be possible). In other words, when the read operation is performed, the supply circuit 20 can realize a read current supply state where drain currents are supplied to the transistors M3 and M4 so that $I_{D4}<I_{D3}=I_{D4}\times n$ holds. However, as described later in detail, there is an exception where the read operation is performed without the read current supply state being realized (see FIG. 14).

In the read current supply state, a ratio between the drain current $I_{D4}$ and the drain current $I_{D1}$ is 1:1 regardless of before or after the program operation, and a ratio between the drain current $I_{D3}$ and the drain current $I_{D2}$ is k:k (k is any real number) before the program operation. Therefore, if a ratio between the drain current $I_{D4}$ and the drain current $I_{D3}$ is 1:n (i.e., $I_{D4}:I_{D3}=1:n$ holds), a ratio between the drain current $I_{D1}$ and the drain current $I_{D2}$ is also 1:n (i.e., $I_{D1}:I_{D2}=1:n$ holds) before the program operation.

Figure 3:
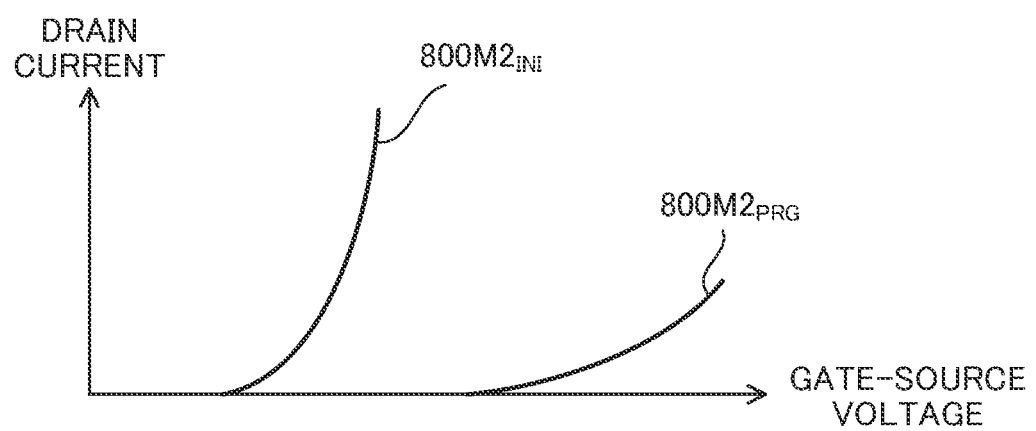
FIG. 3 is a diagram illustrating characteristics of a transistor before and after a program operation, according to the embodiment of the present disclosure.

The program operation is realized by the program circuit 40. In the program operation, the program circuit 40 injects hot carriers into the transistor M2 so as to change electric characteristics of the transistor M2. This change causes the gate threshold voltage of the transistor M2 to increase (rise). See FIG. 3. In FIG. 3, the solid line waveform $800M2_{INI}$ indicates gate-source voltage dependence of the drain current of the transistor M2 before performing the program operation (i.e., in the initial state of the storage circuit 1), and the solid line waveform $800M2_{PRG}$ indicates the gate-source voltage dependence of the drain current of the transistor M2 after performing the program operation.

In the read operation, the signal output circuit 30 outputs a signal $D_{OUT}$ corresponding to a data value stored in the memory unit 10 based on large/small relationship between drain currents of the transistors M1 and M2. The state where the drain current $I_{D2}$ is larger than the drain current $I_{D1}$ corresponds to the state where the memory unit 10 stores data "0". Therefore, in the read operation, if the drain current $I_{D2}$ is larger than the drain current $I_{D1}$, the signal output circuit 30 outputs the signal $D_{OUT}$ corresponding to data "0" (e.g., the signal $D_{OUT}$ at low level). In the read current supply state before the program operation, as illustrated in FIG. 2, the drain current $I_{D2}$ is larger than the drain current $I_{D1}$ ($I_{D2}:I_{D1}=n:1$).

When hot carriers are injected into the transistor M2 by performing the program operation, the gate threshold voltage of the transistor M2 increases. After the program operation, the gate threshold voltage of the transistor M2 may be higher than the gate-source voltage of the transistor M3 in the read current supply state. In this case, the drain current $I_{D2}$ of the transistor M2 becomes substantially zero in the read operation in the read current supply state. At least, due to the increase in the gate threshold voltage of the transistor M2 by the program operation, the drain current $I_{D1}$ becomes larger than the drain current $I_{D2}$ in the read current supply state after the program operation. The state where the drain current $I_{D1}$ is larger than the drain current $I_{D2}$ corresponds to the state where the memory unit 10 stores data "1". Therefore, in the read operation, if the drain current $I_{D1}$ is larger than the drain current $I_{D2}$, the signal output circuit 30 outputs the signal $D_{OUT}$ corresponding to data "1" (e.g., the signal $D_{OUT}$ at high level).

The ratios regarding to the drain currents $I_{D1}$ to $I_{D4}$ can be expressed as follows. Specifically, in the read operation before the program operation is performed (in the read operation in the read current supply state), the ratio of the drain current $I_{D3}$ to the drain current $I_{D4}$ (n:1) and the ratio of the drain current $I_{D2}$ to the drain current $I_{D1}$ (n:1) are identical to each other. The value of the ratio is n/1=n. However, the value of the ratio of the drain current $I_{D2}$ to the drain current $I_{D1}$ decreases to below 1 in the read operation after the program operation (in the read operation in the read current supply state). As a result, after the program operation, $I_{D2}<I_{D1}$ holds in the read current supply state, and the signal $D_{OUT}$ corresponding to data "1" (e.g., the signal $D_{OUT}$ at high level) is output by the read operation.

With the structure described above, it is possible to constitute the storage circuit that is hardly affected by the mismatch described above, and it is possible to realize an optimal design that is not affected by the mismatch. In other words, for example, if the gate threshold voltages of the transistors M1 and M2 are likely to have a difference of 10 mV at most due to a manufacturing error before the program operation, the value of n should be determined so that a correct data is read from the memory unit 10 even if there is the 10 mV mismatch. A merit is that the value of n can be arbitrarily designed corresponding to the assumed mismatch. In addition, if the configuration of the storage circuit 1 is adopted, margin inspection can be easily realized. The margin inspection is described later.

Note that connection relationship among the elements illustrated in FIG. 1 indicates the connection relationship when the read operation is performed. When the program operation is performed, the source and drain of the transistor M2 may be exchanged (although this is not essential). In other words, out of the first and second electrodes of the transistor M2, the high potential side electrode functions as the drain while the low potential side electrode functions as the source. However, it may be possible to change the connection relationship of the circuits using a switch or the like (not shown in FIG. 1), so that out of the first and second electrodes of the transistor M2, the electrode that is connected to the ground (the electrode that functions as the source) in the read operation functions as the drain when the program operation is performed (a detailed circuit example to realize this will be described later).

Among a plurality of examples, some specific configuration examples, operation examples, application techniques, and variation techniques, related to the storage circuit 1 are described below. The matters described above in this embodiment can be applied to the examples described below, unless otherwise noted, and as long as no contradiction arises. In each example, if a contradiction arises with the matters described above, the description of each example may be given higher priority. In addition, as long as no contradiction arises, among the examples described below, a matter described in any example can be applied to any other example (i.e., among the plurality of examples, any two or more examples can be combined).

First Example

Figure 4:
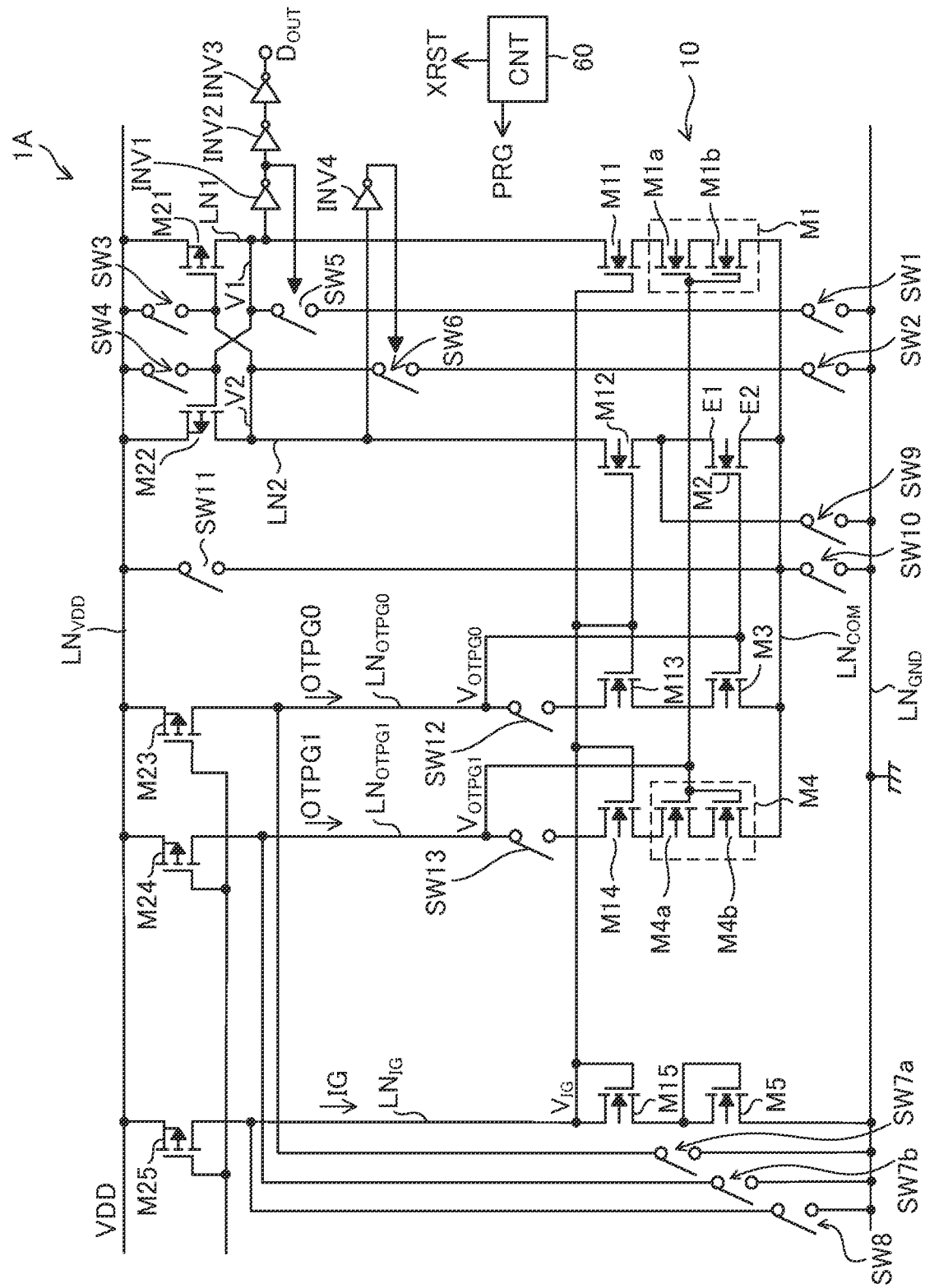
FIG. 4 is a diagram illustrating a storage circuit configuration, according to a first example of the embodiment of the present disclosure.

A first example related to the storage circuit 1 is described below. FIG. 4 illustrates a structure of a storage circuit 1A according to the first example. The storage circuit 1A is an example of the storage circuit 1 of FIG. 1. The storage circuit 1A includes transistors M1 to M5, M11 to M15, and M21 to M25, switches SW1 to SW6, SW7$a$, SW7$b$, and SW8 to SW13, inverters INV1 to INV4, and a control circuit 60. The storage circuit 1A may be constituted of a semiconductor integrated circuit. The control circuit 60 can control on/off of the switches SW1 to SW6, SW7$a$, SW7$b$, SW8 to SW13, and can also control gate voltages of the transistors M23 to M25.

The transistors M1 to M5 and M11 to M15 are N-channel type MOSFETs, while the transistors M21 to M25 are P-channel type MOSFETs. The switches SW1 to SW6, SW7$a$, SW7$b$, and SW8 to SW13 are on/off controlled based on signals output from the control circuit 60 including signals XRST and PRG. FIG. 4 illustrates a state where all the switches are supposed to be in off-state (the same is true in FIG. 5 described later). However, the switch SW13 may be fixed to on-state.

A connection relationship among components of the storage circuit 1A is described below. Power supply line $LN_{VDD}$ is applied with a positive power supply voltage VDD. The power supply voltage VDD has a predetermined positive DC voltage value. Ground line $LN_{GND}$ has the ground potential of 0 V.

The sources of the transistors M21 to M25 and one ends of the switches SW3 and SW4 are connected to the power supply line $LN_{VDD}$. The other end of the switch SW3 is connected to gate of the transistor M21, and the other end of the switch SW4 is connected to gate of the transistor M22. A wiring connected to the gate of the transistor M21 is referred to as a line LN2, and a voltage applied to the line LN2 is referred to as a voltage V2. A wiring connected to the gate of the transistor M22 is referred to as a line LN1, and a voltage applied to the line LN1 is referred to as a voltage V1. The drain of the transistor M21 is connected to the line LN1, and the drain of the transistor M22 is connected to the line LN2.

The input terminal of the inverter INV1 is connected to the line LN1. The output terminal of the inverter INV1 is connected to an input terminal of the inverter INV2. The output terminal of the inverter INV2 is connected to the input terminal of the inverter INV3. The input terminal of the inverter INV4 is connected to the line LN2.

One end of the switch SW5 is connected to the line LN1, and the other end of the switch SW5 is connected to one end of the switch SW1. The other end of the switch SW1 is connected to the ground line $LN_{GND}$. One end of the switch SW6 is connected to the line LN2, and the other end of the switch SW6 is connected to one end of the switch SW2. The other end of the switch SW2 is connected to the ground line $LN_{GND}$.

The gates of the transistors M11 to M15 and the drain of the transistor M15 are commonly connected to a gate line $LN_{IG}$. A voltage applied to the gate line $LN_{IG}$ is referred to as a gate voltage $V_{IG}$.

In the storage circuit 1A, the transistor M1 is constituted of a series circuit of transistors M1$a$ and M1$b$. The transistors M1$a$ and M1$b$ are N-channel type MOSFETs having the same structure. The source of the transistor M1$a$ is connected to the drain of the transistor M1$b$, and the gates of the transistors M1$a$ and M1$b$ are connected to each other. Therefore, the drain of the transistor M1$a$ functions as the drain of the transistor M1, the source of the transistor M1$b$ functions as the source of the transistor M1, and the gates of the transistors M1$a$ and M1$b$ function as the gate of the transistor M1. In addition, in the storage circuit 1A, the transistor M4 is constituted as a series circuit of transistors M4$a$ and M4$b$. The transistors M4$a$ and M4$b$ are N-channel type MOSFETs having the same structure. The source of the transistor M4$a$ is connected to the drain of the transistor M4$b$, and the gates of the transistors M4$a$ and M4$b$ are connected to each other. Therefore, the drain of the transistor M4$a$ functions as the drain of as the drain of the transistor M4, the source of the transistor M4$b$ functions as the source of the transistor M4, and the gates of the transistors M4$a$ and M4$b$ function as the gate of the transistor M4.

The gates of the transistors M2 and M3 are commonly connected to a gate line $LN_{OTPG0}$. The voltage applied to the gate line $LN_{OTPG0}$ is referred to as a gate voltage $V_{OTPG0}$. The gates of the transistors M1 and M4 (i.e., the gates of the transistors M1$a$, M1$b$, M4$a$, and M4$b$) are commonly connected to a gate line $LN_{OTPG1}$. The voltage applied to the gate line $LN_{OTPG1}$ is referred to as a gate voltage $V_{OTPG1}$.

The drain of the transistor M11 is connected to the line LN1, and the source of the transistor M11 is connected to the drain of the transistor M1 (i.e., the drain of the transistor M1$a$). The source of the transistor M1 (i.e., the source of the transistor M1$b$) is connected to a line $LN_{COM}$. The drain of the transistor M12 is connected to the line LN2, and the source of the transistor M12 is connected to an electrode E1 of the transistor M2. A switch SW9 is inserted in series between the electrode E1 of the transistor M2 and the ground line $LN_{GND}$. An electrode E2 of the transistor M2 is connected to the line $LN_{COM}$, and a switch SW10 is inserted in series between the line $LN_{COM}$ and the ground line $LN_{GND}$. In addition, a switch SW11 is inserted in series between the line $LN_{COM}$ and the power supply line $LN_{VDD}$. In the transistor M2, out of the electrodes E1 and E2, the high potential side electrode functions as the drain, while the low potential side electrode functions as the source. As being clear in the description later, in the read operation, the switches SW9, SW10, and SW11 are turned off, on, and off, respectively, and hence the electrode E1 functions as the drain, while in the program operation, the switches SW9, SW10, and SW11 are turned on, off, and on, respectively, and hence the electrode E2 functions as the drain.

A switch SW12 is inserted in series between the gate line $LN_{OTPG0}$ and the drain of the transistor M13. The source of the transistor M13 is connected to the drain of the transistor M3. A switch SW13 is inserted in series between the gate line $LN_{OTPG1}$ and the drain of the transistor M14. The source of the transistor M14 is connected to the drain of the transistor M4 (i.e., the drain of the transistor M4a). The source of the transistor M3 and the source of the transistor M4 (i.e., the source of the transistor M4b) are commonly connected to the line $LN_{COM}$.

The switch SW7a is inserted in series between the gate line $LN_{OTPG0}$ and the ground line $LN_{GND}$. The switch SW7b is inserted in series between the gate line $LN_{OTPG1}$ and the ground line $LN_{GND}$. The switch SW8 is inserted in series between gate line $LN_{IG}$ and the ground line $LN_{GND}$. The drain of the transistor M15 is connected to the gate line $LN_{IG}$, and the source of the transistor M15 is connected to the drain of the transistor M5. The gate and drain of the transistor M5 are connected to each other. The source of the transistor M5 is connected to the ground line $LN_{GND}$.

The drains of the transistors M23, M24, and M25 are connected to the gate lines $LN_{OTPG0}$, $LN_{OTPG1}$, and $LN_{IG}$, respectively. The gates of the transistors M23 to M25 are connected to each other. The transistors M23 to M25 constitute a current mirror circuit. When drain currents flow in the transistors M23 to M25, the drain currents are in proportion to each other. The control circuit 60 can apply the common gate voltage to the gates of the transistors M23 to M25.

An inverter that is one of the inverters INV1 to INV4 outputs from its output terminal an inverted signal of an input signal to its input terminal. In detail, if the input voltage to its input terminal is lower than a predetermined threshold voltage, the inverter outputs a high level signal that is sufficiently higher than the threshold voltage from its output terminal. If the input voltage to its input terminal is the predetermined threshold voltage or higher, the inverter outputs a low level signal that is sufficiently lower than the threshold voltage from its output terminal. The inverters INV1 to INV4 are driven based on the power supply voltage VDD, and the threshold voltage of each inverter is approximately half the power supply voltage VDD. However, the threshold voltage of each inverter may have a hysteresis characteristic. The output signal of the inverter INV3 is the output signal $D_{OUT}$ of the storage circuit 1A. A signal corresponding to the data value stored in the memory unit 10 constituted of the transistors M1 and M2 is output as the output signal $D_{OUT}$ through the read operation.

The control terminal of the switch SW5 is connected to the output terminal of the inverter INV1. The switch SW5 is in on-state or in off-state when the output signal of the inverter INV1 is at high level or at low level, respectively. The control terminal of the switch SW6 is connected to the output terminal of the inverter INV4. The switch SW6 is in on-state or in off-state when the output signal of the inverter INV4 is at high level or at low level, respectively.

The currents flowing from the power supply line $LN_{VDD}$ through the transistors M23, M24, and M25 to the gate lines $LN_{OTPG0}$, $LN_{OTPG1}$, and $LN_{IG}$ are referred to as currents OTPG0, OTPG1, and IG, respectively.

Figure 5:
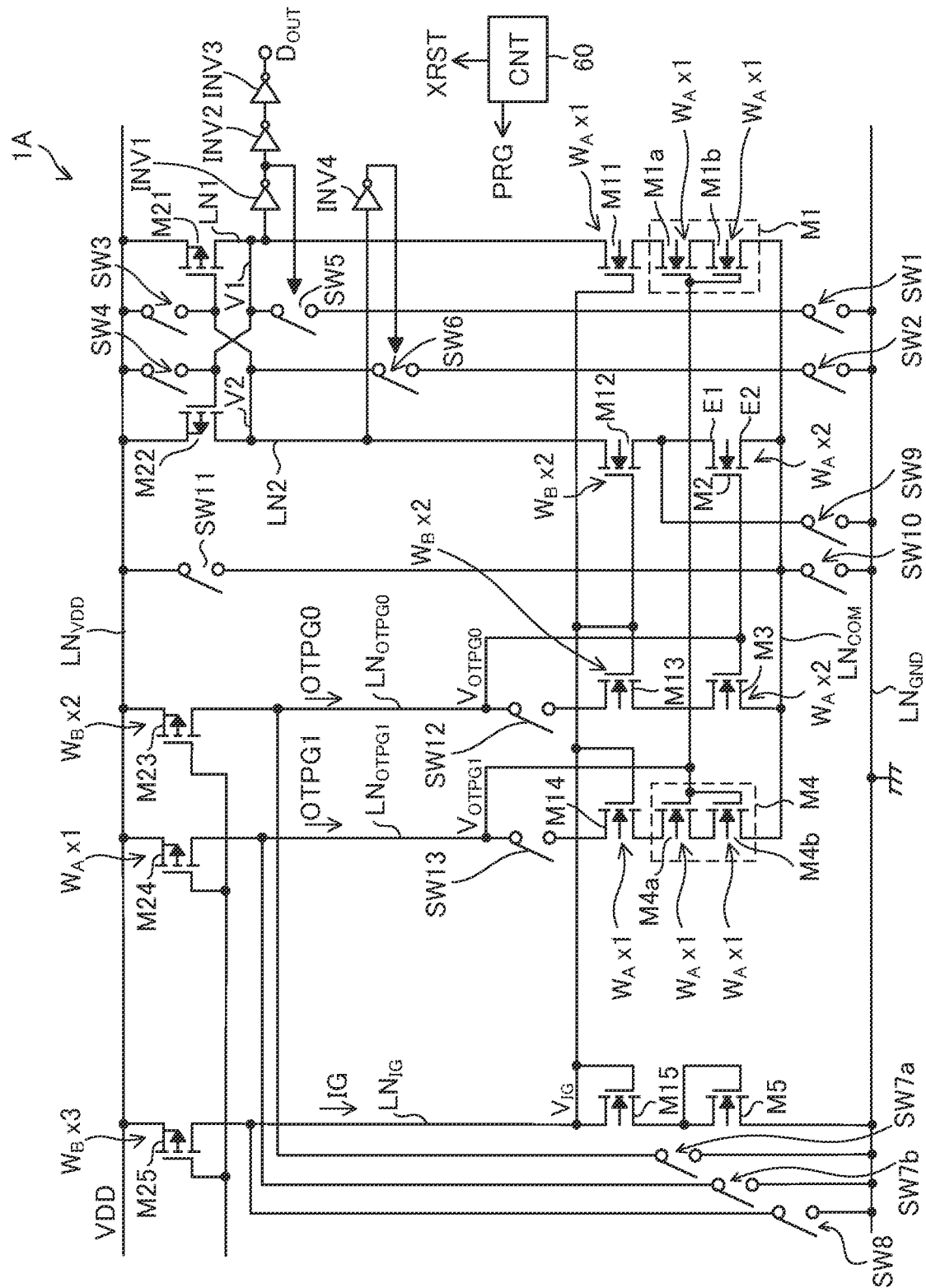
FIG. 5 is a diagram illustrating the storage circuit configuration, according to the first example of the embodiment of the present disclosure.
Figure 6:
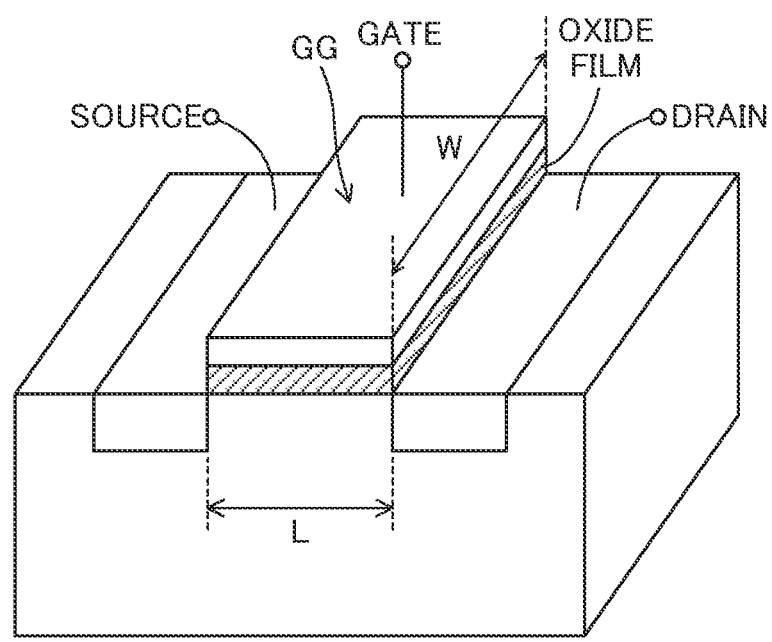
FIG. 6 is a diagram illustrating a structure of a MOSFET.

With reference to FIG. 5, gate widths W of the transistors M1 to M4, M11 to M24, and M23 to M25 are described below. The circuit elements of the storage circuit 1 (the storage circuit 1A in this example) are formed and integrated on a semiconductor substrate, and a structure of any transistor formed as a MOSFET on the semiconductor substrate is characterized by the gate width W and a gate length L. FIG. 6 schematically illustrates a structure of a MOSFET. Any transistor formed as a MOSFET is equipped with a gate electrode GG that functions as a gate. The gate width W and the gate length L define the size of the gate electrode GG in a direction parallel to surfaces (front and back faces) of the semiconductor substrate. Out of these, the gate length L is a distance between drain and source of the transistor (length of the gate electrode GG in the direction connecting drain and source). The gate width W is a length of the gate electrode GG in the direction perpendicular both to the direction defining the gate length L (the direction connecting drain and source) and to the normal direction of the semiconductor substrate (direction perpendicular to the front and back faces of the semiconductor substrate). As for any MOSFET, under a certain condition, the drain current increases when the gate width W increases, and drain current is generally proportional to the gate width W if the gate length L is properly large.

In the storage circuit 1A, the transistors M1 to M4, M11 to M24, and M23 to M25 are constituted as follows (see FIG. 5).

Each of the transistors M1a, M1b, M4a, and M4b is constituted of a single first unit MOSFET, and each of the transistors M2 and M3 is constituted of a parallel circuit of two first unit MOSFETs. The gate width W of the first unit MOSFET has a value $W_A$.

Each of the transistors M11 and M14 is constituted of a single second unit MOSFET, and the gate width W of the second unit MOSFET has the value $W_A$. The second unit MOSFET may have the same structure as the first unit MOSFET. However, the first and second unit MOSFETs may have different gate lengths L.

Each of the transistors M12 and M13 is constituted of a parallel circuit of two third units MOSFET, and the gate width W of the third unit MOSFET has a value $W_B$.

The transistor M24 is constituted of a single fourth unit MOSFET, and the gate width W of the fourth unit MOSFET has the value $W_A$.

The transistor M23 is constituted of a parallel circuit of two fifth units MOSFET, and the transistor M25 is constituted of a parallel circuit of three fifth unit MOSFETs. The gate width W of the fifth unit MOSFET has the value $W_B$.

The gate lengths L of the fourth and fifth unit MOSFET forming the transistors M23 to M25 are much larger than the gate lengths L of the first units MOSFET forming the transistors M1 to M4. It is aimed to stably obtain as designed the current ratio of the current mirror circuit using the transistors M23 to M25 (the drain current ratio of the transistors M23 to M25), and to achieve a smaller size of the transistors M1 to M4 (particularly the transistors M1 and M2). In this example, $W_B$ is set to be twice or substantially twice of $W_A$. As a result, in the state where the switches SW7a, SW7b, and SW8 are in off-state while the switches SW12 and SW13 are in on-state, when drain currents flow in the transistors M23 to M25, the ratio between the current OTPG1 and the current OTPG0 becomes 1:4, and the ratio between the current OTPG0 and the current IG becomes 2:3.

—Read Operation $RD_{INI}$ before Program Operation—

Hereinafter, for convenience sake of description, the read operation performed before the program operation may be referred to as read operation $RD_{INI}$ in particular, and the read operation performed after the program operation may be referred to as read operation $RD_{PRG}$ in particular. When simply referred to as the read operation, it means the read operation before performing the program operation or after performing the same. Note that an inspection mode in which the margin process is performed is described in a later example, but in this example (the first example), presence of the margin process is ignored, and the read operation in a normal mode in which the margin process is not performed is described.

Figure 7:
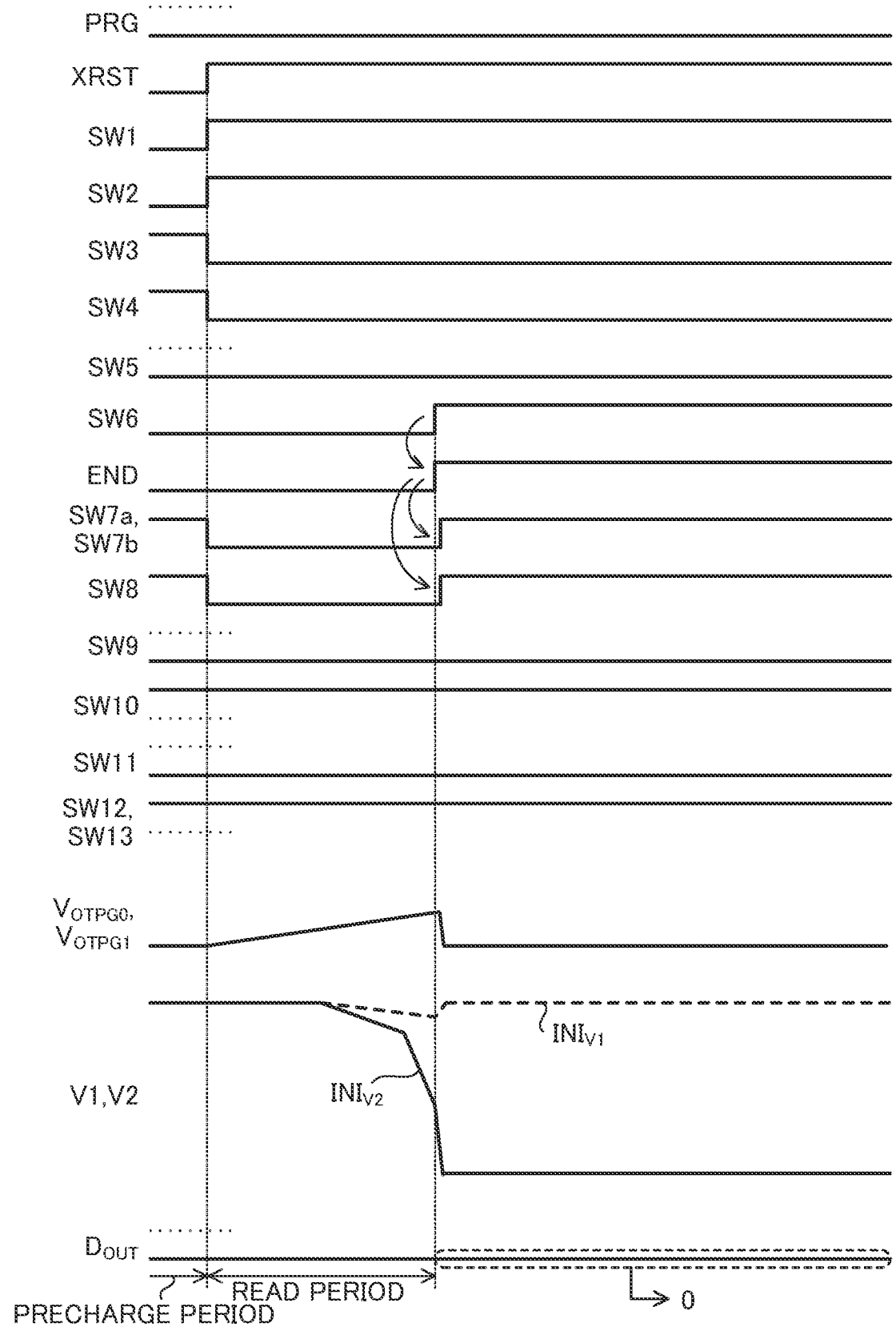
FIG. 7 is a timing chart of read operation before the program operation, according to the first example of the embodiment of the present disclosure.

FIG. 7 is a timing chart of the read operation $RD_{INT}$. In the read operation, a low level period of the signal XRST is referred to as a precharge period, and a high level period of the signal XRST in which the switches SW5 and SW6 are both in off-state is referred to as a read period. In the read period after the precharge period, the read operation is realized. In the period where the program operation is not performed (including the precharge period and the read period), the signal PRG is maintained at low level. On the precondition that the signal PRG is at low level, when the signal XRST is changed from low level to high level, the precharge period is changed to the read period, in which a signal corresponding to data stored in the memory unit 10 is output as the output signal $D_{OUT}$ via the read period.

Figure 8:
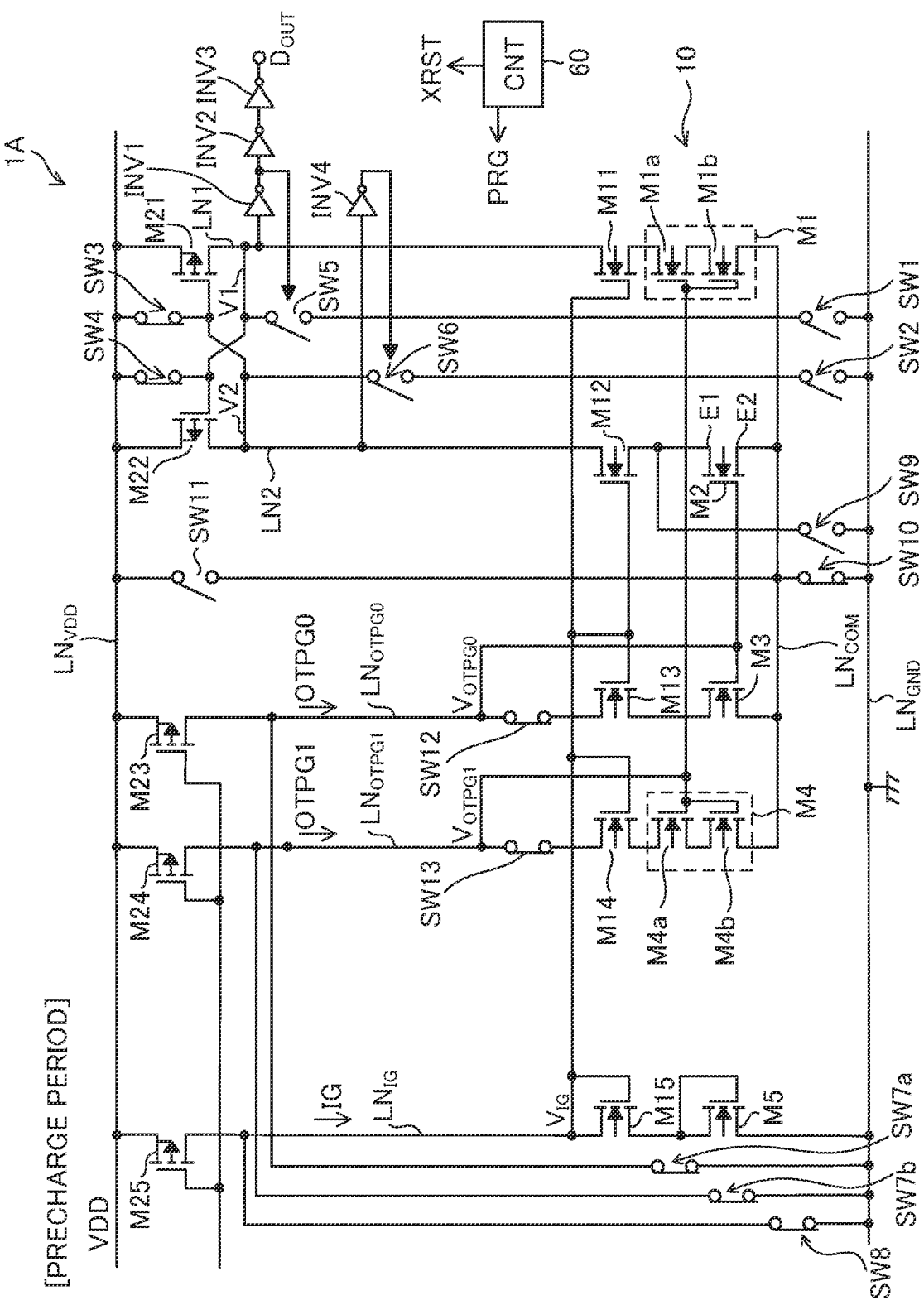
FIG. 8 is a diagram illustrating a state (switch state) of precharge period in the read operation, according to the first example of the embodiment of the present disclosure.

In the precharge period, as illustrated in FIG. 8, on the basis of the low level signals XRST and PRG, the switches SW1 and SW2 are turned off while the switches SW3, SW4, SW7a, SW7b, and SW8 are turned on. In addition, in the precharge period, the control circuit 60 sets the gate voltages of the transistors M23 to M25 to the power supply voltage VDD so that the transistors M23 to M25 are in off state. In addition, in the low level period of the signal PRG, the switches SW9 and SW11 are turned off while the switch SW10 is turned on. Therefore, in the period where the program operation is not performed (including the precharge period and the read period), in the transistor M2, the electrode E1 functions as the drain while the electrode E2 functions as the source. In addition, in the precharge period and in the read period, the switches SW12 and SW13 are fixed to on-state, and also after the read period the switches SW12 and SW13 are maintained in on-state.

In FIG. 7, a broken line waveform $INI_{V1}$ indicates a waveform of the voltage V1 in the read operation $RD_{INT}$, while a solid line waveform $INI_{V2}$ indicates a waveform of the voltage V2 in the read operation $RD_{INT}$. From the precharge period to the first half of the read period, the waveforms $INI_{V1}$ and the $INI_{V2}$ are identical to each other. Although specific voltage values of the gate voltages $V_{OTPG0}$ and $V_{OTPG1}$ are different to each other, behaviors of the voltages are similar to each other in the read operation. FIG. 7 illustrates a typical waveform of one of the gate voltages $V_{OTPG0}$ and $V_{OTPG1}$ (the same is true in FIG. 11 described later). In the precharge period, the voltages $V_{IG}$, $V_{OTPG0}$, and $V_{OTPG1}$ are 0 V, and hence the transistors M1 to M5, and M11 to M15 are all in off-state.

In addition, in the precharge period, a positive charge is supplied to the lines LN1 and LN2 through the switches SW4 and SW3, and the voltages V1 and V2 reach the level of the power supply voltage VDD. Therefore, in the precharge period, the output signals of the inverters INV1 and INV4 are at low level, and as a result, the switches SW5 and SW6 are in off-state.

Figure 9:
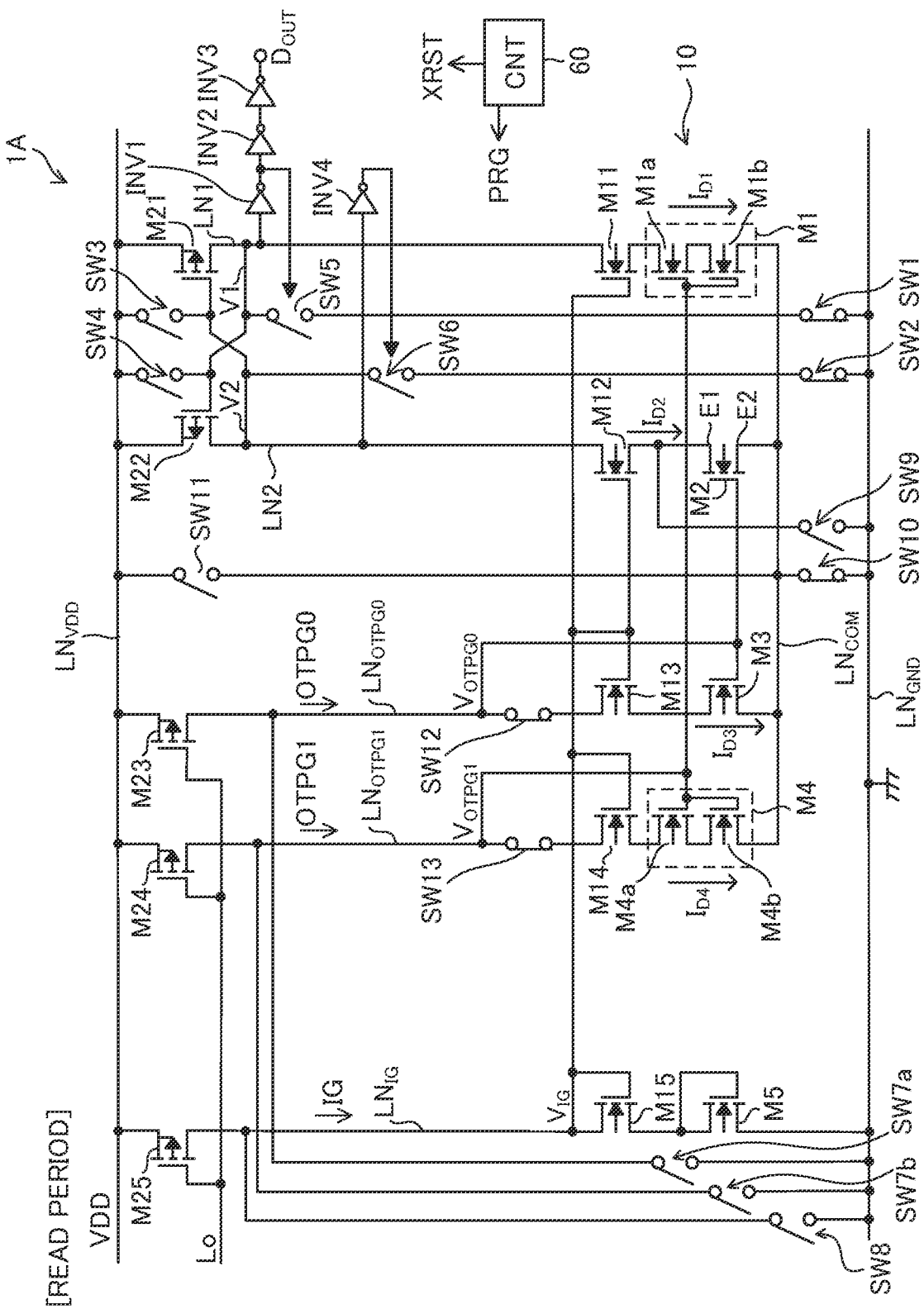
FIG. 9 is a diagram illustrating a state (switch state) of read period in the read operation, according to the first example of the embodiment of the present disclosure.

When the signal XRST changes from low level to high level, the precharge period is changed to the read period. In the read period, as illustrated in FIG. 9, on the basis of the high level signal XRST and the low level signal PRG, the switches SW1 and SW2 are turned on while the switches SW3, SW4, SW7a, SW7b, and SW8 are turned off. Furthermore, in the read period, the control circuit 60 sets the gate voltages of the transistors M23 to M25 to low level (a low voltage further lower than the voltage that is lower than the power supply voltage VDD by the gate threshold voltages of the transistors M23 to M25), and hence drain currents flows in the transistors M23 to M25. As a result, in the read period, the currents IG, OTPG0, and OTPG1 cause the gate voltage $V_{IG}$, $V_{OTPG0}$, and $V_{OTPG1}$ to increase. In this case, by setting the current $I_{IG}$ larger than the currents $I_{OTPG0}$ and $I_{OTPG1}$, the gate voltage $V_{IG}$ increases more rapidly than the gate voltages $V_{OTPG0}$ and $V_{OTPG1}$, and hence the transistors M11 to M14 can be in on-state before the gate voltage $V_{OTPG0}$ reaches the gate threshold voltage of the transistors M2 and M3 and before the gate voltage $V_{OTPG1}$ reaches the gate threshold voltages of the transistors M1 and M4.

In the read period, along with the increases in the gate voltages $V_{IG}$, $V_{OTPG0}$, and $V_{OTPG1}$, the transistors M5 and M11 to M15 become on-state, and drain currents flow in the transistors M1 to M4. In the read period, the drain currents flowing in the transistors M1 and M2, M3, and M4 are denoted by $I_{D1}$, $I_{D2}$, $I_{D3}$, and $I_{D4}$, respectively (see FIG. 9). In the read period, the current OTPG0 flows as the drain current $I_{D3}$ of the transistor M3, and the current OTPG1 flows as the drain current $I_{D4}$ of the transistor M4. As described above, the ratio between the current OTPG1 and the current OTPG0 is 1:n, which is 1:4 here. Therefore, in the read period before the program operation is performed, the ratio between the drain current $I_{D1}$ and the drain current $I_{D2}$ is also 1:4 (i.e., the drain current $I_{D2}$ is four times the drain current $I_{D1}$ when errors are ignored). As a result, the voltage V2 decreases more rapidly than the voltage V1. In addition, while the voltage V2 decreases, the drain current comes to flow in the transistor M21. Therefore, the decrease in the voltage V1 stops when the voltage V2 has decreased to a certain extent, and the voltage V1 increases to the level of the power supply voltage VDD.

Figure 10:
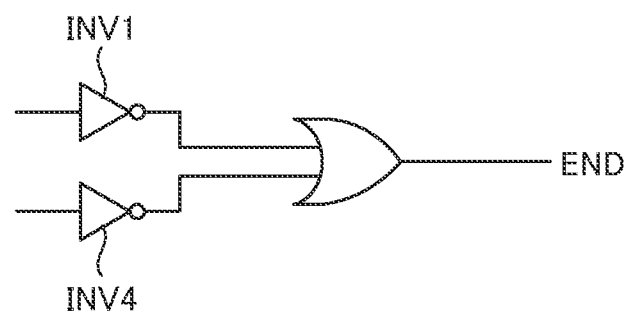
FIG. 10 is a diagram illustrating relationship among a plurality of signals, according to the first example of the embodiment of the present disclosure.

When the voltage V2 becomes lower than the threshold voltage of the inverter INV4 in the state where V1>V2 holds, the output signal of the inverter INV4 changes from low level to high level, and the switch SW6 changes from off-state to on-state. As illustrated in FIG. 10, a signal END is an OR signal between the output signal of the inverter INV1 and the output signal of the inverter INV4. Therefore, when at least one of the output signals of the inverters INV1 and INV4 becomes high level, the signal END becomes high level. The signal END can be understood to be an internal signal generated in the control circuit 60.

When the signal END becomes high level, the control circuit 60 sets the gate voltages of the transistors M23 to M25 to the power supply voltage VDD so as to turn off the transistors M23 to M25. Furthermore, when the signal END becomes high level, the control circuit 60 turns on the switches SW7a, SW7b, and SW8, so as to decrease the gate voltages $V_{OTPG0}$, $V_{OTPG1}$, and $V_{IG}$ to 0 V.

In the read operation, the signal $D_{OUT}$ after the signal END becomes high level is referred to as a read confirmation signal $D_{OUT}$, in particular. The read confirmation signal $D_{OUT}$ indicates a data value stored in the memory unit 10 (a data value read from the memory unit 10). If the read confirmation signal $D_{OUT}$ is at low level, it means that the data value is "0". If the read confirmation signal $D_{OUT}$ is at high level, it means that the data value is "1". In the read operation $RD_{INT}$, the output signal of the inverter INV1 is kept at low level, and hence the read confirmation signal $D_{OUT}$ is also at low level so that data "0" (i.e., the initial value data) is read out. In the read operation $RD_{INT}$, after the signal END becomes high level, the read confirmation signal $D_{OUT}$ indicating data "0" is output continuously. Therefore, it is not necessary to dispose a latch circuit in the post part, and it is possible to directly supply the read confirmation signal $D_{OUT}$ to a circuit that needs the read confirmation signal $D_{OUT}$ (e.g., a trimming switch that is turned on/off corresponding to the stored data of the memory unit 10).

—Read Operation $RD_{PRG}$ after Program Operation—

Figure 11:
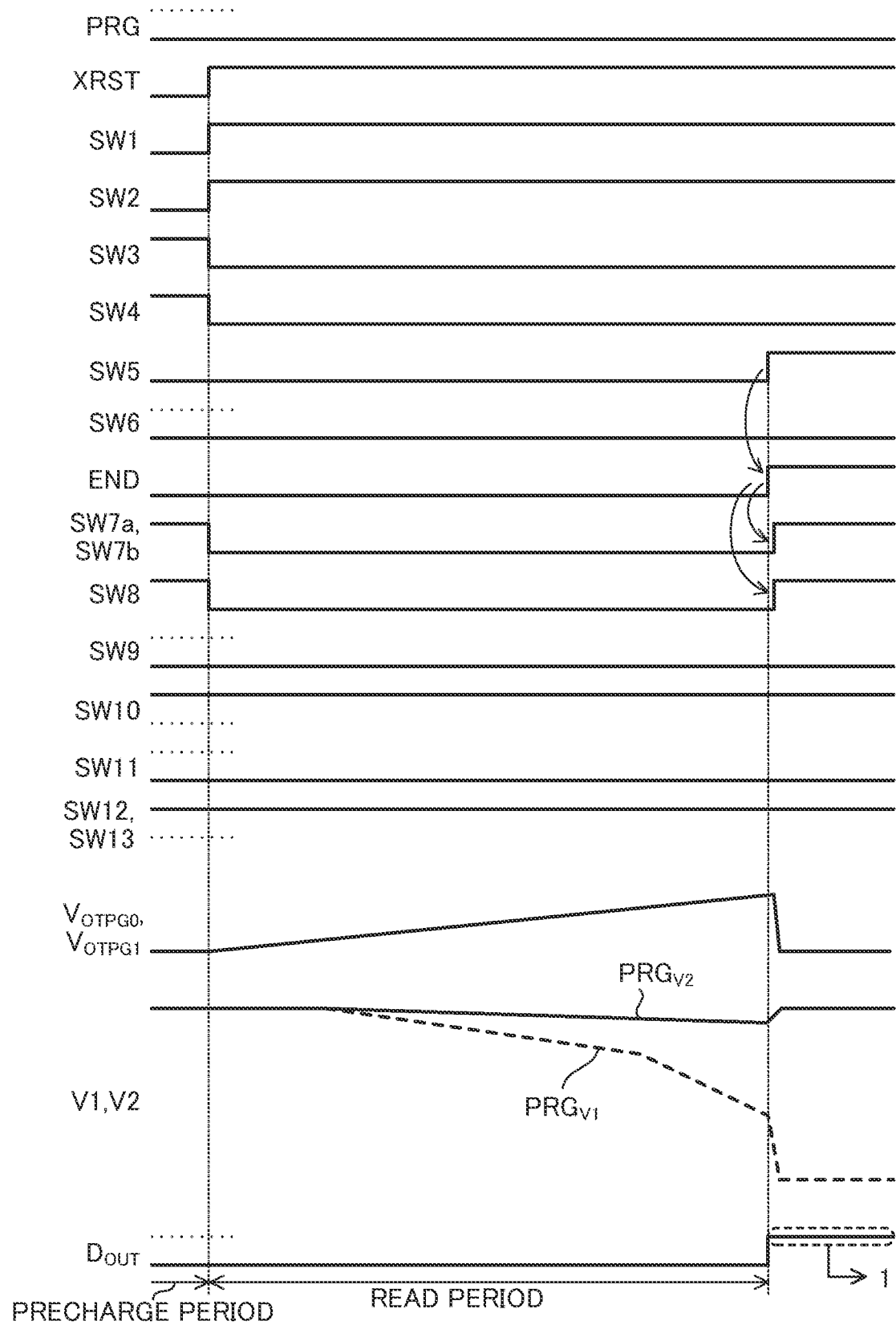
FIG. 11 is a timing chart of the read operation after the program operation, according to the first example of the embodiment of the present disclosure.

FIG. 11 is a timing chart of the read operation $RD_{PRG}$ (i.e., the read operation performed after performing the program operation). In FIG. 11, a broken line waveform $PRG_{V1}$ indicates a waveform of the voltage V1 in the read operation $RD_{PRG}$, and a solid line waveform $PRG_{V2}$ indicates a waveform of the voltage V2 in the read operation $RD_{PRG}$. The waveforms $PRG_{V1}$ and $PRG_{V2}$ are identical to each other from the precharge period to a first half of the read period.

Read operation contents including control of switch states in the precharge period and in the read period are the same before and after performing the program operation. However, due to the program operation performed before the read operation $RD_{PRG}$, characteristics of only the transistor M2 out of the transistors M1 and M2 is changed, and only the gate threshold voltage of the transistor M2 is largely increased. Therefore, during the read period of the read operation $RD_{PRG}$, the drain current $I_{D1}$ is larger than the drain current $I_{D2}$. As a result, the voltage V1 decreases more rapidly than the voltage V2. In addition, while the voltage V1 decreases, the drain current comes to flow in the transistor M22. Therefore, when the voltage V1 is decreased to a certain extent, the decrease in the voltage V2 is stopped, and the voltage V2 increases to the level of the power supply voltage VDD.

When the voltage V1 is decreased to below the threshold voltage of the inverter INV1 in the state where V1<V2 holds, the output signal of the inverter INV1 changes from low level to high level, and the switch SW5 changes from off-state to on-state. In addition, when the output signal of the inverter INV1 changes from low level to high level, the signal END also changes from low level to high level (see FIG. 10). When the signal END becomes high level, the control circuit 60 sets the gate voltages of the transistors M23 to M25 to the power supply voltage VDD, so as to turn off the transistors M23 to M25. Furthermore, when the signal END becomes high level, the control circuit 60 turns on the switches SW7a, SW7b, and SW8 so that the gate voltages $V_{OTPG0}$, $V_{OTPG1}$, and $V_{IG}$ decrease to 0 V.

In the read operation, the signal $D_{OUT}$ after the signal END becomes high level is referred to as the read confirmation signal $D_{OUT}$ in particular, as described above. In the read operation $RD_{PRG}$, when the voltage V1 decreases, the output signal of the inverter INV1 becomes high level, and hence the read confirmation signal $D_{OUT}$ becomes high level so as to indicate data "1". In the read operation $RD_{PRG}$, after the signal END becomes high level, the read confirmation signal $D_{OUT}$ indicating data "1" is output continuously. Therefore, it is not necessary to dispose a latch circuit in the post part, and it is possible to directly supply the read confirmation signal $D_{OUT}$ to a circuit that needs the read confirmation signal $D_{OUT}$ (e.g., a trimming switch that is turned on/off corresponding to the stored data of the memory unit 10).

—Program Operation—

In this way, in the read operation (read period), the state where the drain current $I_{D2}$ is larger than the drain current ID corresponds to the state where the memory unit 10 stores data "0". In the read operation $RD_{INI}$ of FIG. 7, the drain current $I_{D2}$ is larger than the drain current $I_{D1}$, and hence the read confirmation signal $D_{OUT}$ corresponding to data "0" (here, the signal $D_{OUT}$ at low level) is output. On the contrary, in the read operation (read period), the state where the drain current $I_{D1}$ is larger than the drain current $I_{D2}$ corresponds to the state where the memory unit 10 stores data "1". In the read operation $RD_{PRG}$ of FIG. 11, the drain current $I_{D1}$ is larger than the drain current $I_{D2}$, and hence the read confirmation signal $D_{OUT}$ corresponding to data "1" (here, the signal $D_{OUT}$ at high level) is output.

In the storage circuit 1A of FIG. 4, the program operation that causes the change from the read operation $RD_{INI}$ of FIG. 7 to the read operation $RD_{PRG}$ of FIG. 11 is realized as follows.

Figure 12:
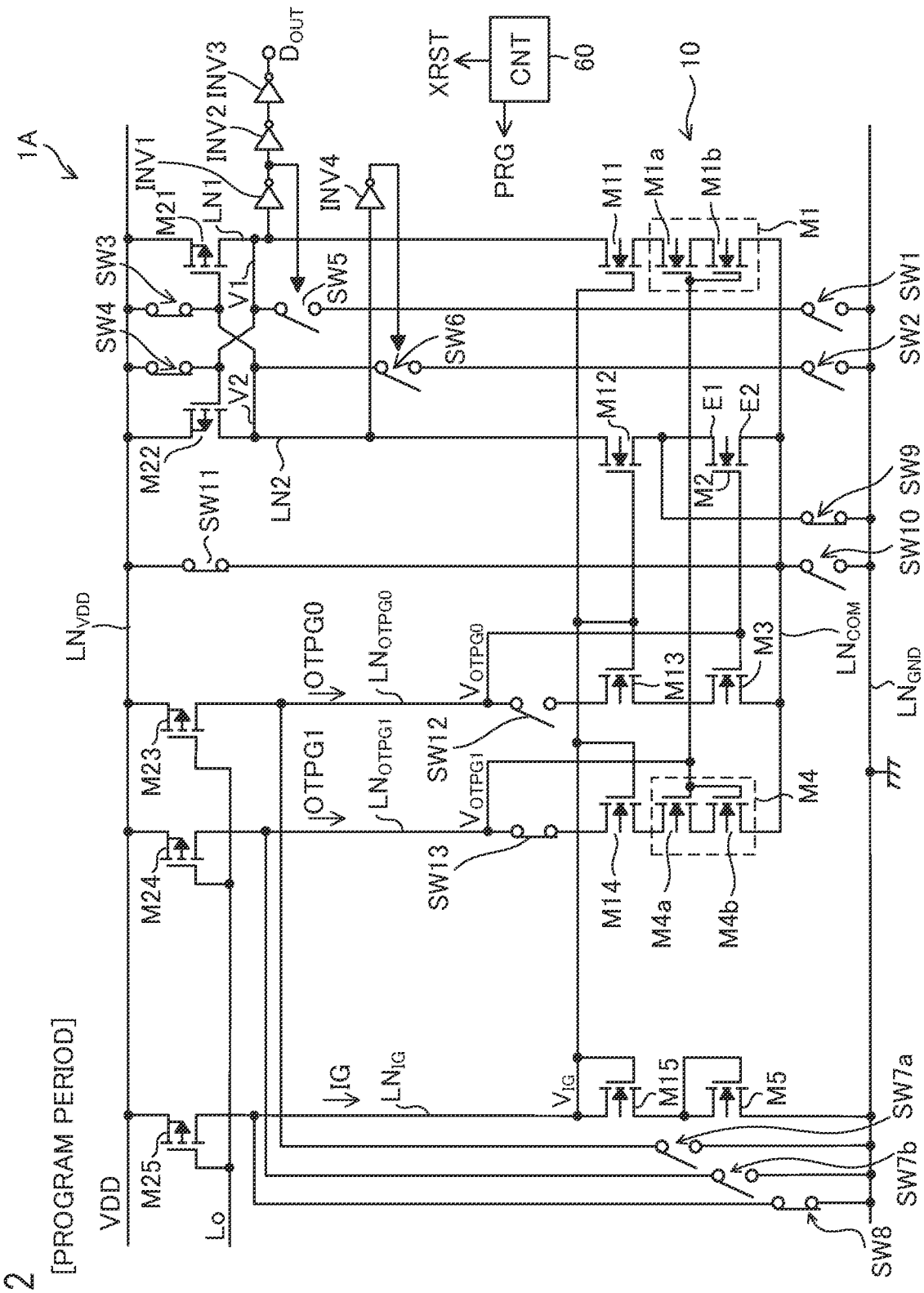
FIG. 12 is a diagram illustrating a state (switch state) of program period, according to the first example of the embodiment of the present disclosure.

FIG. 12 illustrates states of the switches in the storage circuit 1A in the period where the program operation is performed (Hereinafter, referred to as a program period). In the program period, the signal XRST is at low level while the signal PRG is at high level, and on the basis of these signals XRST and PRG, the switches SW1, SW2, SW7a, SW7b, SW10, and SW12 are turned off while the switches SW3, SW4, SW8, SW9, and SW11 are turned on. The switch SW13 may be fixed to on-state regardless of the signals XRST and PRG. In addition, in the program period, the control circuit 60 sets the gate voltages of the transistors M23 to M25 to low level (a voltage still lower than the voltage that is lower than the power supply voltage VDD by each gate threshold voltage of the transistors M23 to M25). Therefore, the power supply voltage VDD is applied to the electrode E2 of the transistor M2 through the switch SW11, and the power supply voltage VDD is applied to the gate of the transistor M2 through the transistor M23. Further, the potential of the electrode E1 of the transistor M2 becomes 0 V. In addition, when the switch SW8 is turned on, the transistors M11 to M15 are all turned off.

In the program period, the electrode E2 functions as the drain of the transistor M2, and the electrode E1 functions as the source of the transistor M2, so that the current flows from the electrode E2 to the electrode E1. In this current flowing process, hot carriers are injected into the transistor M2, so that characteristics of the transistor M2 change, and the gate threshold voltage of the transistor M2 increases. After maintaining the state of FIG. 12 for a time period necessary for sufficiently increasing the gate threshold voltage of the transistor M2, the signal PRG is changed from high level to low level, and the program operation is finished.

Note that the program operation described above may be modified as follows. Specifically, a switch (not shown) is inserted between the power supply line $LN_{VDD}$ and the gate of the transistor M2, and this switch is turned on only in the program period, so that the power supply voltage VDD is supplied to the gate of the transistor M2 during the program period. In this case, during the program period, the power supply voltage VDD may be applied to the gates of the transistors M23 to M25 so that the transistors M23 to M25 are turned off. Other than that, in the program period, any circuit modification may be performed as long as the gate threshold voltage of the transistor M2 can be increased by the hot carrier injection into the transistor M2.

In addition, in the above description, one memory unit 10 is noted, and it is assumed that hot carriers are injected into the transistor M2 of the noted memory unit 10 in the program operation. However, it is possible to constitute a non-volatile memory including a plurality of the memory units 10. In the non-volatile memory including a plurality of memory units 10, hot carriers are injected by the program operation described above only into the transistor M2 of the memory unit 10 in which data "1" should be written, and hot carriers are not injected into the transistor M2 of other memory units 10 (memory units 10 whose stored data should be maintained at "0").

Second Example

Figure 13:
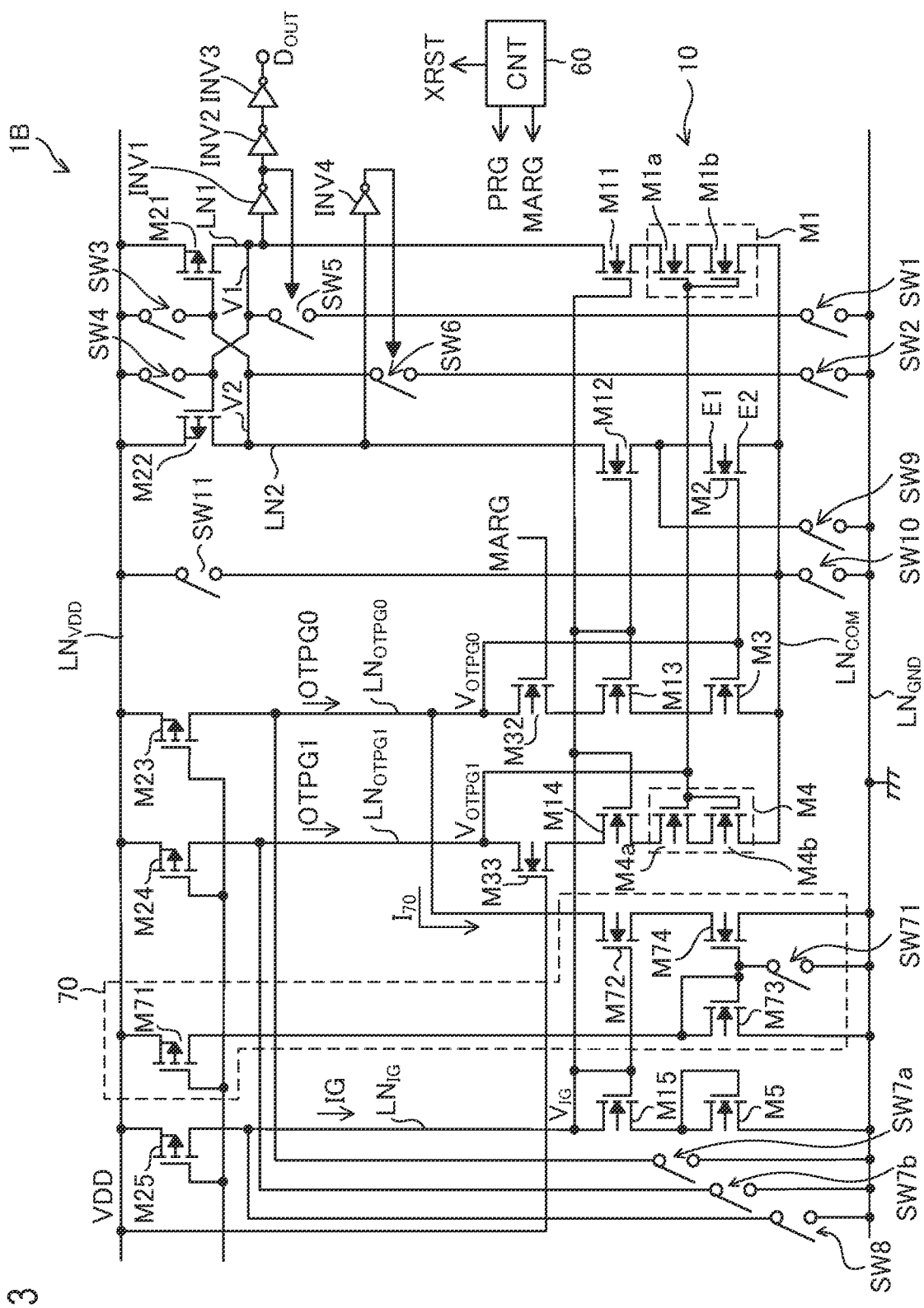
FIG. 13 is a diagram illustrating the storage circuit configuration, according to a second example of the embodiment of the present disclosure.

A second example related to the storage circuit 1 is described below. FIG. 13 illustrates a structure of a storage circuit 1B according to the second example. The storage circuit 1B is an example of the storage circuit 1 of FIG. 1. The storage circuit 1B is obtained by adding an additional circuit (shunt circuit) 70 to the storage circuit 1A according to the first example. Transistors M32 and M33 disposed in the storage circuit 1B correspond to the switches SW12 and SW13 of FIG. 4, respectively, and the control circuit 60 supplies a gate signal MARG to the gate of the switch SW32. Except for these points, the storage circuit 1B of FIG. 13 has the same configuration as the storage circuit 1A of FIG. 4.

The transistors M32 and M33 are N-channel type MOSFETs. In the transistor M32, the drain is connected to the line $LN_{OTPG0}$, the source is connected to the drain of the transistor M13, and the gate receives the gate signal MARG. In the transistor M33, the drain is connected to the line $LN_{OTPG1}$, and the source is connected to the drain of the transistor M14. The gate of the transistor M33 is connected to the power supply line $LN_{VDD}$. Therefore, the transistor M33 is always on-state. On the basis of the signal output from the control circuit 60 including the signals XRST and PRG, the switches SW1 to SW6, SW7a, SW7b, SW8 to SW11, and SW71 are on/off controlled, and FIG. 13 illustrates a state where all the switches are assumed to be off-state. Note that the switch SW71 is kept in on-state during the period (program period) in which the program operation is performed by the switch state of FIG. 12.

The additional circuit 70 includes transistors M71 to M74 and the switch SW71. The transistor M71 is a P-channel type MOSFET, and the transistors M72 to M74 are N-channel type MOSFETs. The source of the transistor M71 is connected to the power supply line $LN_{VDD}$. The gate of the transistor M71 is commonly connected to the gates of the transistors M23 to M25. The drain of the transistor M71, the drain and gate of the transistor M73, and the gate of the transistor M74 are connected to each other. The sources of the transistors M73 and M74 are connected to the ground line $LN_{GND}$. In the transistor M72, the drain is connected to the line $LN_{OTPG0}$, and the gate is connected to the line $LN_{IG}$. The source of the transistor M72 and the drain of the transistor M74 are connected to each other. One end of the switch SW71 is connected to the gates of the transistors M73 and M74, and the other end of the switch SW71 is connected to the ground line $LN_{GND}$.

The transistor M71 has the same structure as the transistor M24. In other words, the transistor M71 is constituted of the single fourth unit MOSFET similarly to the transistor M24, and the gate width W of the fourth unit MOSFET has the value $W_A$ as described above (see FIG. 5). The transistors M23 to M25, and M71 form a current mirror circuit. The gate length of the fourth unit MOSFET constituting the transistor M24 is much larger than the gate length L of the first unit MOSFETs constituting the transistors M1 to M4, similarly to the fourth and fifth unit MOSFETs forming the transistors M23 to M25. It is aimed to stably obtain as designed the current ratio of the current mirror circuit using the transistors M23 to M25 and M71 (the drain current ratio of the transistors M23 to M25 and M71), and to achieve a smaller size of the transistors M1 to M4 (particularly the transistors M1 and M2).

In the state where the switches SW7a, SW7b, SW8, and SW71 are in off-states while the transistors M32 and M33 are in on-states, when the drain currents flows in the transistors M23 to M25 and M71, the current having the same current value as the current OTPG1 flows in the drain of the transistor M73, and the current having the same current value as the drain current of the transistor M73 flows as current $I_{70}$ in the drains of the transistors M72 and M74.

Here, the non-volatile memory including the storage circuit 1 (the storage circuit 1B in this example) can operate in one of the plurality of operation modes including the normal mode (a first mode) and the inspection mode (a second mode). It can be considered that the control circuit 60 is equipped with an operation mode setting unit (not shown) for setting an operation mode of the non-volatile memory. When the non-volatile memory including the storage circuit 1 (the storage circuit 1B in this example) is activated, the control circuit 60 sets the operation mode of the non-volatile memory to the normal mode in principle. However, if a predetermined inspection signal is input to the non-volatile memory, the control circuit 60 exceptionally sets the operation mode of the non-volatile memory to the inspection mode. The inspection signal may be input to the non-volatile memory from a not-shown external device for inspection. The inspection mode is an operation mode that is mainly used in inspection for shipment of the non-volatile memory, and the control circuit 60 can execute the first or second margin process in the inspection mode. However, the first or the second margin process may be performed in any stage other than the inspection for shipment. The margin inspection can be performed by the first or second margin process. The additional circuit 70 is a circuit that significantly functions in the first margin process. The second margin process will be described later in other example, and the first margin process is described below.

The first margin process is a process to inspect whether or not the value "0" can be read with a margin from the memory unit 10 in the normal mode in which the program operation is not performed on the memory unit 10. Therefore, the first margin process is performed only on the memory unit 10 on which the program operation is not performed, or significantly functions only on the memory unit 10 on which the program operation is not performed. Therefore, if the non-volatile memory includes a plurality of the memory units 10, it is sufficient to perform the first margin process only on the memory unit 10 on which the program operation is not performed. Here, one of the memory units 10 on which the program operation is not performed is noted.

As described above in the first example, the read operation performed before the program operation is referred to as the read operation $RD_{INI}$ in particular. The read operation $RD_{INI}$ in the normal mode is as described above in the first example. In the read operation $RD_{INI}$ in the normal mode, the control circuit 60 turns on the switch SW71, and current does not flow in the transistors M72 and M74 (i.e., $I_{70}=0$). Therefore, in the read period of the read operation $RD_{INI}$ in the normal mode, all the current OTPG0 flows in the transistor M3.

In the first margin process in the inspection mode, the read operation $RD_{INI}$ is performed in the state where the switch SW71 is in off-state. In other words, in the read operation $RD_{INI}$ by the first margin process (i.e., in the read operation $RD_{INI}$ in the inspection mode), the switch SW71 is turned off during the read period. Except for that the switch SW71 is turned off during the read period, the read operation $RD_{INI}$ in the inspection mode is the same as the read operation $RD_{INI}$ in the normal mode. During the read period of the read operation $RD_{INI}$ in the inspection mode, the current OTPG0 is divided into the current flowing in the transistor M3 and the current (170) flowing in the transistor M74.

As for the read operation $RD_{INI}$ in the normal mode, a ratio between the drain current of the transistor M4 and the drain current of the transistor M3 in the read period is expressed by 1:$n_A$. Then, as for the read operation $RD_{INI}$ in the normal mode, a ratio between the drain current of the transistor M1 and the drain current of the transistor M2 in the read period is also 1:$n_A$. As for the read operation $RD_{INI}$ in the inspection mode, the ratio between the drain current of the transistor M4 and the drain current of the transistor M3 in the read period is expressed by 1:$n_B$. Then, as for the read operation $RD_{INI}$ in the normal mode, a ratio between the drain current of the transistor M1 and the drain current of the transistor M2 in the read period is also 1:$n_B$. Here, $n_A$ is n in the normal mode while $n_B$ is n in the inspection mode, each of which is larger than 1. In the inspection mode, the drain current of the transistor M3 is decreased by the current $I_{70}$, compared with in the normal mode. Therefore, $n_A > n_B$ holds. Here, $n_A = 4$ and $n_B = 3$ hold.

In the first margin process, the read operation $RD_{INI}$ is performed in the state where the switch SW71 is turned off, and in the read operation $RD_{INI}$, it is checked whether or not the data value read from the memory unit 10 is "0". This checking is performed based on level of the read confirmation signal $D_{OUT}$ described above. Then, if the data value read from the memory unit 10 in the first margin process is "0", a first margin normal signal is output, and otherwise a first margin bad signal is output. The above-mentioned checking operation and output operation of the first margin normal signal or the first margin bad signal may be performed in a circuit (not shown) within the non-volatile memory, or may be performed in a circuit (not shown) outside the non-volatile memory.

The first margin normal signal means that the value "0" can be read with a margin from the memory unit 10 in the normal mode in the state where the program operation is not performed on the memory unit 10. $n_A - n_B$ corresponds to the margin. The first margin bad signal means that the value "0" cannot be read with a margin from the memory unit 10 in the normal mode in the state where the program operation is not performed on the memory unit 10. For instance, it is possible to take an action such as excluding the non-volatile memory causing the first margin bad signal from shipment as a defective.

In this way, in the read operation $RD_{INI}$ of the normal mode, the ratio of the drain current of the transistor M3 to the drain current of the transistor M4 in the read period is set to a first ratio ($n_A$:1), and in the read operation $RD_{INI}$ of the inspection mode related to the first margin process, the ratio of the drain current of the transistor M3 to the drain current of the transistor M4 in the read period is set to a second ratio ($n_B$:1). In this case, the first ratio ($n_A$) and the second ratio ($n_B$) are each set larger than 1, and the second ratio ($n_B$) is set smaller than the first ratio ($n_A$).

By the first margin process, it can be easily checked whether or not the value "0" can be read with a margin from the memory unit 10 that should keep the value "0" (i.e., whether or not there is a sufficient margin for keeping the value "0").

Although 4 and 3 are exemplified as specific values of the first ratio ($n_A$) and the second ratio ($n_B$), the ratios may have any values as long as $n_A > 1$, $n_B > 1$, and $n_A > n_B$ are satisfied. If $n_A > 1$, $n_B > 1$, and $n_A > n_B$ are satisfied, the method for realizing the first margin process can also be variously modified. For instance, it may be possible to add, instead of the additional circuit 70, another additional circuit (not shown) to the storage circuit TA, which increases the drain current of the transistor M4 during the read period in the read operation $RD_{INI}$ in the inspection mode than in the normal mode. Due to the increase in the drain current of the transistor M4 by the another additional circuit, the drain current of the transistor M3 viewed from the drain current of the transistor M4 is relatively decreased, and $n_A > n_B$ can be realized.

Third Example

A third example related to the storage circuit 1 is described below. As described above in the second example, the non-volatile memory including the storage circuit 1 can operate in one of the plurality of operation modes including the normal mode and the inspection mode. As for the normal mode and the inspection mode, the matter described in the second example is also applied to the third example. In the third example, the second margin process that can be performed in the inspection mode is described.

The second margin process is a process to inspect whether or not the value "1" can be read with a margin from the memory unit 10 in the normal mode after the program operation is performed on the memory unit 10. Therefore, the second margin process is performed only on the memory unit 10 after the program operation is performed, or significantly functions only on the memory unit 10 after the program operation is performed. Therefore, if the non-volatile memory includes a plurality of the memory units 10, it is sufficient to perform the second margin process only on the memory unit 10 after the program operation is performed. Here, one of the memory units 10 after the program operation is performed is noted. Note that the second margin process can be performed on either one of configurations of the storage circuit 1A according to the first example and the storage circuit 1B according to the second example. Here, with reference to FIG. 14, it is supposed that the second margin process is performed on the configuration of the storage circuit 1A (it may be considered that illustration of the additional circuit 70 is simply omitted in FIG. 14).

As described above in the first example, the read operation that is performed after the program operation is referred to as the read operation $RD_{PRG}$ in particular. The read operation $RD_{PRG}$ in the normal mode is as described above in the first example. As described above in the first example, the switch SW12 is turned on during the read period in the read operation $RD_{PRG}$ of the normal mode.

In the second margin process of the inspection mode, the read operation $RD_{PRG}$ is performed in the state where the switch SW12 is turned off. In other words, in the read operation $RD_{PRG}$ by the second margin process (i.e., in the read operation $RD_{PRG}$ in the inspection mode), as illustrated in FIG. 14, the switch SW12 is turned off during the read period. Except for that the switch SW12 is turned off during the read period, the read operation $RD_{PRG}$ in the inspection mode is the same as the read operation $RD_{PRG}$ in the normal mode.

As for the read operation $RD_{PRG}$ in the normal mode, the switch SW12 is turned on in the read period, and hence current that is n times the current OTPG1 flows as the current OTPG0 in the transistors M23, M13, and M3, and the gate voltage $V_{OTPG0}$ corresponding to this current is applied to the gate of the transistor M2. This gate voltage $V_{OTPG0}$ is at least lower than the power supply voltage VDD.

In contrast, as for the read operation $RD_{PRG}$ in the inspection mode (i.e., the read operation $RD_{PRG}$ in the second margin process), the switch SW12 is turned off during the read period, and hence current does not flow in the transistors M13 and M3. At this time, as a low level signal is applied to the gate of the transistor M23, the transistor M23 is turned on, and hence the power supply voltage VDD is applied to the gate of the transistor M2 substantially as it is (i.e., $V_{OTPG0}$=VDD holds substantially).

Therefore, the gate voltage of the transistor M2 during the read period is higher in the read operation $RD_{PRG}$ of the inspection mode than in the read operation $RD_{PRG}$ of the normal mode. As a result, the drain current of the transistor M2 during the read period is larger or tends to be larger in the read operation $RD_{PRG}$ of the inspection mode than in the read operation $RD_{PRG}$ of the normal mode. However, if the gate threshold voltage of the transistor M2 is sufficiently high after the program operation, the drain current of the transistor M2 during the read period is substantially zero also in the read operation $RD_{PRG}$ of the inspection mode.

In the second margin process, the read operation $RD_{PRG}$ is performed in the state where the switch SW12 is turned off, and it is checked whether or not the data value read from the memory unit 10 in the read operation $RD_{PRG}$ is "1". This checking is performed based on the level of the read confirmation signal $D_{OUT}$ described above. Further, if the data value read from the memory unit 10 by the second margin process is "1", the second margin normal signal is output, and otherwise the second margin bad signal is output. The above-mentioned checking operation and output operation of the second margin normal signal or the second margin bad signal may be performed by a circuit (not shown) inside the non-volatile memory, or may be performed by a circuit (not shown) outside the non-volatile memory.

The second margin normal signal means that the value "1" can be read with a margin from the memory unit 10 in the normal mode after the program operation is performed on the memory unit 10. The second margin bad signal means that the value "1" cannot be read with a margin from the memory unit 10 in the normal mode after the program operation is performed on the memory unit 10. For instance, it is possible to take an action such as excluding the non-volatile memory causing the second margin bad signal from shipment as a defective. Alternatively, when the second margin bad signal is obtained, it is also possible to perform the program operation again on the corresponding memory unit 10.

In this way, in the read operation $RD_{PRG}$ of the normal mode, the state (the read current supply state) is realized in which the drain currents $I_{D4}$ and $I_{D3}$ satisfying $I_{D4}:I_{D3}$=1:n in the read period are supplied to the transistors M4 and M3. On the other hand, in the read operation $RD_{PRG}$ of the inspection mode, the drain current $I_{D4}$ (the drain current having the same current value as the drain current $I_{D4}$ in the normal mode) is supplied only to the transistor M4 out of the transistors M3 and M4 during the read period, and a predetermined voltage is supplied to the gate of the transistor M2. In this case, the predetermined voltage is set higher than the gate voltage of the transistor M2 in the read current supply state (i.e., the voltage $V_{OTPG0}$ during the read period in the read operation $RD_{PRG}$ of the normal mode). Here, although the power supply voltage VDD is used as the predetermined voltage, the predetermined voltage may be different from the power supply voltage VDD.

With the second margin process, it can be easily checked whether or not the value "1" can be read with a margin from the memory unit 10 that should keep the value "1" (i.e., whether or not there is a sufficient margin for keeping the value "1").

Note that the second margin process can be modified as follows. A modified second margin process is described below. First, in the modified second margin process, the switch SW12 is fixed to on-state as described above in the first example. Instead, the storage circuit 1A is provided with a first additional circuit (not shown) to decrease the drain current of the transistor M4 during the read period in the read operation $RD_{PRG}$ to be smaller in the inspection mode than in the normal mode, or a second additional circuit (not shown) to increase the drain current of the transistor M3 during the read period in the read operation $RD_{PRG}$ to be larger in the inspection mode than in the normal mode. For instance, the first additional circuit can be realized by a circuit configuration similar to the additional circuit 70 of FIG. 13.

As for the read operation $RD_{PRG}$ of the normal mode, the ratio between the drain current of the transistor M4 and the drain current of the transistor M3 in the read period is expressed by 1:$n_A$. As for the read operation $RD_{PRG}$ of the inspection mode, the ratio between the drain current of the transistor M4 and the drain current of the transistor M3 in the read period is expressed by 1:$n_B$. Each of $n_A$ and $n_B$ is larger than 1. When using the modified second margin process, $n_A$<$n_B$ is satisfied by the first or second additional circuit. For instance, if $n_A$=4 hold, $n_B$=6 or $n_B$=8 can be set. Any values of them can be adopted as long as $n_A$>1, $n_B$>1, and $n_A$<$n_B$ are satisfied.

In this way, in the read operation $RD_{PRG}$ of the normal mode, the ratio of the drain current of the transistor M3 to the drain current of the transistor M4 in the read period is set to the first ratio ($n_A$:1), and in the read operation $RD_{PRG}$ of the inspection mode related to the modified second margin process, the ratio of the drain current of the transistor M3 to the drain current of the transistor M4 in the read period is set to the second ratio ($n_B$:1). In this case, the first ratio ($n_A$) and the second ratio ($n_B$) are each set larger than 1, and the second ratio ($n_B$) is set larger than the first ratio ($n_A$). In this way too, it is possible to check the margin for keeping the value "1".

Fourth Example

A fourth example related to the storage circuit 1 is described below. In the fourth example, correspondence between the storage circuit 1 of FIG. 1 and the storage circuit 1A of FIG. 4 or the storage circuit 1B of FIG. 13 is additionally described. The storage circuit 1B of FIG. 13 is merely the storage circuit 1A plus the additional circuit 70, and therefore a relationship between the storage circuits 1 and 1A is described below. First, the memory unit 10 is constituted of the transistors M1 and M2 commonly in the storage circuits 1 and 1A.

The voltage/current supply circuit 20 of FIG. 1 is mainly constituted of the transistors M23 and M24 in the storage circuit 1A of FIG. 4. In addition, if any additional circuit described above in the second or third example (the additional circuit 70 in FIG. 13) is provided to the storage circuit 1, the additional circuit is also included as a component of the supply circuit 20. The ratio $I_{D3}:I_{D4}$, i.e., the value of n is set by the supply circuit 20 in cooperation with the transistors M3 and M4. The first ratio $n_A$ and the second ratio $n_B$ described above are examples of the ratio $I_{D3}:I_{D4}$. To supply current or voltage, a current source or a voltage source is necessary. Therefore, it can be understood that a power supply circuit (not shown) that generates and outputs the power supply voltage VDD is also included as a component of the supply circuit 20. The same is true for the signal output circuit 30 and the program circuit 40.

In addition, it can be said that the storage circuit 1A of FIG. 4 is equipped with a drain current control circuit to permit or inhibit supply of the drain currents $I_{D1}$ to $I_{D4}$ to the transistors M1 to M4, and the drain current control circuit is constituted to include the transistors M5, M11 to M15, and M25, and the switch SW8.

The signal output circuit 30 of FIG. 1 is mainly constituted of the transistors M21 and M22, the switches SW1 to SW6, and the inverters INV1 to INV4 in the storage circuit 1A of FIG. 4.

The program circuit 40 of FIG. 1 is constituted to include the switches SW9 to SW12 in the storage circuit 1A of FIG. 4.

The control circuit 60 of FIG. 4 can be understood to be a circuit to control operations of the supply circuit 20, the signal output circuit 30, and the program circuit 40 (and is further a circuit to control operation of the drain current control circuit described above). Alternatively, the control circuit 60 can also be understood to be a circuit that is shared by the circuits 20, 30, and 40 for realizing the read operation and the program operation as parts of the circuits 20, 30, and 40.

Note that in the storage circuits 1, 1A, and 1B, in the read operation, if $I_{D2} > I_{D1}$ holds, the signal $D_{OUT}$ associated with the first value (the read confirmation signal $D_{OUT}$) is output, while if $I_{D2} < I_{D1}$ holds, the signal $D_{OUT}$ associated with the second value (the read confirmation signal $D_{OUT}$) is output. In the operation example described above, the first value is "0" while the second value is "1", but the first and second values can be any values as long as the first and second value are different from each other. In addition, the circuit configuration may be modified in such a manner that the signal $D_{OUT}$ associated with the first value is a high level signal while the signal $D_{OUT}$ associated with the second value is a low level signal.

Fifth Example

A fifth example related to the storage circuit 1 is described. The storage circuit 1, 1A, or 1B illustrated in FIG. 1, 4, or 13 is a first non-volatile memory that stores one bit data, but it is possible to constitute a second non-volatile memory that stores a plurality of bits of data by using a plurality of the storage circuits 1, 1A, or 1B, each of which is a unit cell.

Alternatively, it may be possible to constitute a unit cell as a combination of the memory unit 10 and the signal output circuit 30, and to constitute a third non-volatile memory including a plurality of the unit cells. In the third non-volatile memory, the gate voltage generation unit 12, the supply circuit 20, and the program circuit 40 are shared among the plurality of unit cells. In other words, for example, the third non-volatile memory is provided with a sharing circuit constituted of a combination of the transistors M3 to M5, M13 to M15, and M23 to M25, and the switches SW7a, SW7b, SW8, and SW10 to SW13 as illustrated in FIG. 4, and one sharing circuit is shared by a plurality of unit cells. Therefore, the gate of the single transistor M3 in the sharing circuit is connected to the gates of the transistors M2 of the plurality of unit cells, and the gate of the single transistor M4 in the sharing circuit is connected to the gates of the transistors M1 of the plurality of unit cells. As a result, the gate voltage $V_{OTPG0}$ applied to the gate of the single transistor M3 is commonly applied to the gates of the transistors M2 of the plurality of unit cells, and the gate voltage $V_{OTPG1}$ applied to the gate of the single transistor M4 is commonly applied to the gates of the transistors M1 of the plurality of unit cells. In the third non-volatile memory, the transistors M11 and M12 and the switch SW9 are disposed in each unit cell. The program circuit 40 in the third non-volatile memory injects hot carriers only into the transistor M2 of the unit cell in which "1" should be written out of the plurality of unit cells in the program operation.

In any case, in the non-volatile memory according to the present disclosure, the number of bits of the stored data is arbitrary as long as it is 1 or larger, and the memory units 10 are disposed corresponding to the number of bits of the stored data.

Sixth Example

A sixth example related to the storage circuit 1 is described. The non-volatile memory according to the present disclosure can be incorporated in any circuit or device that realizes a predetermined functional operation.

When the power supply voltage is supplied to the circuit or device including the non-volatile memory so that the circuit or the device is activated, the circuit or the device reads the data stored in the non-volatile memory by the read operation, and realizes a predetermined functional operation corresponding to the read data.

For instance, the non-volatile memory is incorporated in an amplifier circuit (not shown) that can change the amplification factor according to trimming data, and 1 or more data stored in the non-volatile memory are supplied to the amplifier circuit as the trimming data, so that the amplification factor of the amplifier circuit can be optimally adjusted.

In addition, the non-volatile memory according to this embodiment can be incorporated in semiconductor integrated circuits of various usages, such as a semiconductor integrated circuit for a DC/DC converter, or a semiconductor integrated circuit for a motor driver. The amplifier circuit described above is an example of the circuit disposed in these semiconductor integrated circuits.

Variations

The embodiments of the present disclosure can be variously and appropriately modified within the scope of the technical concept recited in the claims. The embodiments described above are merely examples of the embodiment of the present disclosure, and meanings of terms of the present disclosure or structural elements are not limited to those described above in the embodiments. Specific values indicated in the above description are merely examples, and they can be changed to various values as a matter of course.

As for any signal or voltage, a relationship between high level and low level can be opposite to that described above, without deviating from the spirit of the above description.

The channel type of the field effect transistor (FET) described in each embodiment is an example. The circuit configuration including the FET can be modified in such a manner that the N-channel type FET is changed to the P-channel type FET, or the P-channel type FET is changed to the N-channel type FET.

As long as no contradiction arises, any transistor in the above description may be any type of transistor. For instance, any transistor described above as a MOSFET can be replaced by a junction type FET, an insulated gate bipolar transistor (IGBT), or a bipolar transistor, as long as no contradiction arises. Any transistor has a first electrode, a second electrode, and a control electrode. In an FET, one of the first and second electrodes is a drain and the other is a source, and the control electrode is a gate. In an IGBT, one of the first and second electrodes is a collector and the other is an emitter, and the control electrode is a gate. In a bipolar transistor that does not belong to IGBT, one of the first and second electrodes is a collector and the other is an emitter, and the control electrode is a base.

ADDITIONAL REMARKS

The technical concepts implemented in the embodiments described above are considered below.

A non-volatile memory according to the present disclosure includes a first transistor; a second transistor; a third transistor having a gate commonly connected to a gate of the second transistor; a fourth transistor having a gate commonly connected to a gate of the first transistor; a line to which sources of the first to fourth transistors are commonly connected; a supply circuit configured to be capable of supplying drain currents to the third and fourth transistors; and a signal output circuit. The non-volatile memory performs read operation in a read current supply state, in which the supply circuit supplies drain current of the fourth transistor, and drain current larger than the drain current of the fourth transistor is supplied to the third transistor, and the signal output circuit is configured to output a signal associated with a first value or a signal associated with a second value, on the basis of the drain currents of the first and second transistors in the read operation (first configuration).

In the non-volatile memory according to the first configuration, the signal output circuit may be configured to output the signal associated with the first value if the drain current of the second transistor is larger than the drain current of the first transistor, and to output the signal associated with the second value if the drain current of the first transistor is larger than the drain current of the second transistor, in the read operation (second configuration).

In the non-volatile memory according to the second configuration, a configuration may be adopted in which the non-volatile memory is capable of performing a program operation to increase a gate threshold voltage of the second transistor by injecting hot carriers into the second transistor, in the read operation performed before the program operation, the drain current of the second transistor is larger than the drain current of the first transistor, and in the read operation performed after the program operation, the drain current of the first transistor is larger than the drain current of the second transistor, due to increase in the gate threshold voltage of the second transistor by the program operation (third configuration).

In the non-volatile memory according to the third configuration, a configuration may be adopted in which in the read operation performed before the program operation, a ratio of the drain current of the third transistor to the drain current of the fourth transistor is the same as a ratio of the drain current of the second transistor to the drain current of the first transistor, and the latter ratio becomes smaller than 1 in the read operation after the program operation (fourth configuration).

In the non-volatile memory according to the third or fourth configuration, a configuration may be adopted in which the second and third transistors have the same structure, while the first and fourth transistors have the same structure, the first and fourth transistors have the same gate threshold voltage before and after the program operation, and the second and third transistors have the same gate threshold voltage before the program operation (fifth configuration).

In the non-volatile memory according to any one of the third to fifth configurations, a configuration may be adopted in which the non-volatile memory is capable of operating in a first mode or in a second mode, before the program operation the supply circuit sets the ratio of the drain current of the third transistor to the drain current of the fourth transistor to a first ratio in the read operation of the first mode, and sets the ratio of the drain current of the third transistor to the drain current of the fourth transistor to a second ratio in the read operation of the second mode, the first ratio and the second ratio are each larger than 1, and the second ratio is smaller than the first ratio (sixth configuration).

In the non-volatile memory according to any one of the third to fifth configurations, a configuration may be adopted in which the non-volatile memory is capable of operating in a first mode or in a second mode, after the program operation the supply circuit realizes the read current supply state in the read operation of the first mode, and supplies the drain current only to the fourth transistor out of the third and fourth transistors while applies a predetermined voltage to the gate of the second transistor in the read operation of the second mode, and the predetermined voltage is higher than a gate voltage of the second transistor in the read current supply state (seventh configuration).

In the non-volatile memory according to any one of the third to fifth configurations, a configuration may be adopted in which the non-volatile memory is capable of operating in a first mode or in a second mode, after the program operation the supply circuit sets the ratio of the drain current of the third transistor to the drain current of the fourth transistor to a first ratio in the read operation of the first mode, and sets the ratio of the drain current of the third transistor to the drain current of the fourth transistor to a second ratio in the read operation of the second mode, the first ratio and the second ratio are each larger than 1, and the second ratio is larger than the first ratio (eighth configuration).

Another non-volatile memory according to the present disclosure includes a first transistor; a second transistor; a third transistor having a gate commonly connected to a gate of the second transistor; a fourth transistor having a gate commonly connected to a gate of the first transistor; a line to which sources of the first to fourth transistors are commonly connected; a supply circuit configured to be capable of supplying drain currents to the third and fourth transistors; and a signal output circuit. The non-volatile memory is configured to be capable of performing a read operation in a read current supply state, in which the supply circuit supplies drain current of the fourth transistor, and drain current larger than the drain current of the fourth transistor is supplied to the third transistor, and the signal output circuit is configured to be capable of outputting a signal associated with a first value or a signal associated with a second value based on the drain currents of the first and second transistors in the read operation, when the read operation is performed (ninth configuration).

The invention claimed is:
1. A non-volatile memory comprising:
   a first transistor;
   a second transistor;
   a third transistor having a gate commonly connected to a gate of the second transistor;
   a fourth transistor having a gate commonly connected to a gate of the first transistor;

a line to which sources of the first to fourth transistors are commonly connected;

a supply circuit configured to be capable of supplying drain currents to the third and fourth transistors; and a signal output circuit, wherein the non-volatile memory performs read operation in a read current supply state, in which the supply circuit supplies drain current of the fourth transistor, and drain current larger than the drain current of the fourth transistor is supplied to the third transistor, and the signal output circuit is configured to output a signal associated with a first value or a signal associated with a second value, on the basis of the drain currents of the first and second transistors in the read operation, wherein the signal output circuit is configured to output the signal associated with the first value if the drain current of the second transistor is larger than the drain current of the first transistor, and to output the signal associated with the second value if the drain current of the first transistor is larger than the drain current of the second transistor, in the read operation, wherein the non-volatile memory is capable of performing a program operation to increase a gate threshold voltage of the second transistor by injecting hot carriers into the second transistor, in the read operation performed before the program operation, the drain current of the second transistor is larger than the drain current of the first transistor, and in the read operation performed after the program operation, the drain current of the first transistor is larger than the drain current of the second transistor, due to increase in the gate threshold voltage of the second transistor by the program operation.

2. The non-volatile memory according to claim 1, wherein in the read operation performed before the program operation, a ratio of the drain current of the third transistor to the drain current of the fourth transistor is the same as a ratio of the drain current of the second transistor to the drain current of the first transistor, and the latter ratio becomes smaller than 1 in the read operation after the program operation.

3. The non-volatile memory according to claim 1, wherein the second and third transistors have the same structure, while the first and fourth transistors have the same structure, the first and fourth transistors have the same gate threshold voltage before and after the program operation, and the second and third transistors have the same gate threshold voltage before the program operation.

4. The non-volatile memory according to claim 1, wherein the non-volatile memory is capable of operating in a first mode or in a second mode, before the program operation, the supply circuit sets the ratio of the drain current of the third transistor to the drain current of the fourth transistor to a first ratio in the read operation of the first mode, and sets the ratio of the drain current of the third transistor to the drain current of the fourth transistor to a second ratio in the read operation of the second mode, the first ratio and the second ratio are each larger than 1, and the second ratio is smaller than the first ratio.

5. The non-volatile memory according to claim 1, wherein the non-volatile memory is capable of operating in a first mode or in a second mode, after the program operation, the supply circuit realizes the read current supply state in the read operation of the first mode, and supplies the drain current only to the fourth transistor out of the third and fourth transistors while applies a predetermined voltage to the gate of the second transistor in the read operation of the second mode, and the predetermined voltage is higher than a gate voltage of the second transistor in the read current supply state.

6. The non-volatile memory according to claim 1, wherein the non-volatile memory is capable of operating in a first mode or in a second mode, after the program operation, the supply circuit sets a ratio of the drain current of the third transistor to the drain current of the fourth transistor to a first ratio in the read operation of the first mode, and sets a ratio of the drain current of the third transistor to the drain current of the fourth transistor to a second ratio in the read operation of the second mode, the first ratio and the second ratio are each larger than 1, and the second ratio is larger than the first ratio.

7. A non-volatile memory comprising:

a first transistor;

a second transistor;

a third transistor having a gate commonly connected to a gate of the second transistor;

a fourth transistor having a gate commonly connected to a gate of the first transistor;

a line to which sources of the first to fourth transistors are commonly connected;

a supply circuit configured to be capable of supplying drain currents to the third and fourth transistors; and a signal output circuit, wherein the non-volatile memory performs read operation in a read current supply state, in which the supply circuit supplies drain current of the fourth transistor, and drain current larger than the drain current of the fourth transistor is supplied to the third transistor, the signal output circuit is configured to output a signal associated with a first value or a signal associated with a second value, on the basis of the drain currents of the first and second transistors in the read operation, and wherein in the read operation, a ratio of the drain current of the third transistor to the drain current of the fourth transistor is the same as a ratio of the drain current of the second transistor to the drain current of the first transistor.

* * * * *